US012562767B2

(12) United States Patent
Tsuda

(10) Patent No.: US 12,562,767 B2
(45) Date of Patent: Feb. 24, 2026

(54) RADIO-FREQUENCY MODULE AND COMMUNICATION DEVICE

(71) Applicant: Murata Manufacturing Co., Ltd., Nagaokakyo (JP)

(72) Inventor: Motoji Tsuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 415 days.

(21) Appl. No.: 18/236,405

(22) Filed: Aug. 22, 2023

(65) Prior Publication Data

US 2023/0396278 A1     Dec. 7, 2023

Related U.S. Application Data

(63) Continuation of application No. PCT/JP2022/000940, filed on Jan. 13, 2022.

(30) Foreign Application Priority Data

Feb. 22, 2021     (JP) ................................. 2021-026495

(51) Int. Cl.
*H04B 1/38*         (2015.01)
*H03H 9/64*         (2006.01)
*H03H 9/72*         (2006.01)

(52) U.S. Cl.
CPC ............. *H04B 1/38* (2013.01); *H03H 9/6406* (2013.01); *H03H 9/72* (2013.01)

(58) Field of Classification Search
CPC ........... H04B 1/38; H03H 9/6406; H03H 9/72
See application file for complete search history.

(56) References Cited

U.S. PATENT DOCUMENTS 10,840,956 B2 *  11/2020  Naniwa ..................... H04B 1/10
11,863,215 B2 *   1/2024  Tsuda ........................ H04B 1/18
(Continued)

FOREIGN PATENT DOCUMENTS

JP       2020-027974 A     2/2020
JP       2020-102693 A     7/2020
(Continued)

OTHER PUBLICATIONS

International Search Report and Written Opinion mailed on Mar. 29, 2022, received for PCT Application PCT/JP2022/000940, filed on Jan. 13, 2022, 9 pages including English Translation.

*Primary Examiner* — Lewis G West
(74) *Attorney, Agent, or Firm* — XSENSUS LLP

(57) ABSTRACT

In a radio-frequency module, an electronic component includes a first transmission filter, a second transmission filter, a first input terminal and a first output terminal, and a second input terminal and a second output terminal. The first input terminal is connected to an input end of a signal path of the first transmission filter. The second input terminal is connected to an input end of a signal path of the second transmission filter. The first transmission filter includes a first substrate. The second transmission filter includes a second substrate. The first substrate and the second substrate are common. The electronic component further includes a metallic member at ground potential. In the electronic component, the metallic member is arranged between the first input terminal and the second input terminal in a side view.

20 Claims, 9 Drawing Sheets

(56) References Cited

U.S. PATENT DOCUMENTS

| | | | | |
|---|---|---|---|---|
| 2009/0130999 | A1* | 5/2009 | Chen ........................ | H04B 1/18 |
| | | | | 455/129 |
| 2010/0253435 | A1* | 10/2010 | Ichitsubo ............ | H01L 25/0655 |
| | | | | 29/832 |
| 2015/0119102 | A1* | 4/2015 | Saji ......................... | H04B 1/38 |
| | | | | 455/550.1 |
| 2021/0152202 | A1* | 5/2021 | Uejima ................ | H04B 1/0458 |

FOREIGN PATENT DOCUMENTS

| | | | |
|---|---|---|---|
| WO | 2014/119046 | A1 | 8/2014 |
| WO | 2019/240095 | A1 | 12/2019 |
| WO | 2019/240096 | A1 | 12/2019 |
| WO | 2020/054284 | A1 | 3/2020 |
| WO | 2020/071021 | A1 | 4/2020 |

* cited by examiner

RADIO-FREQUENCY MODULE AND COMMUNICATION DEVICE

CROSS REFERENCE TO RELATED APPLICATIONS

This application is a continuation of international application no. PCT/JP2022/000940, filed Jan. 13, 2022, and which claims priority to Japanese patent application no. JP 2021-026495, filed Feb. 22, 2021. The entire contents of all prior applications are hereby incorporated by reference.

TECHNICAL FIELD

The present disclosure generally relates to a radio-frequency module and a communication device, and more particularly, to a radio-frequency module including a first transmission filter and a second transmission filter, and a communication device including the radio-frequency module.

BACKGROUND ART

Patent Document 1 discloses a radio-frequency module including a module substrate (mounting substrate), a first transmission filter, and a second transmission filter. The module substrate has a first main surface and a second main surface facing each other. The first transmission filter is mounted on the first main surface of the module substrate and allows a radio-frequency transmission signal in a transmission band of a first communication band to pass therethrough. The second transmission filter allows a radio-frequency transmission signal in a transmission band of a second communication band to pass therethrough. The radio-frequency module disclosed in Patent Document 1 is capable of simultaneously transmitting a radio-frequency transmission signal in the first communication band and a radio-frequency transmission signal in the second communication band.

CITATION LIST

Patent Document

Patent Document 1: International Publication No. 2019/240095

SUMMARY

Technical Problems

Among other things, in the radio-frequency module disclosed in Patent Document 1, when the first transmission filter and the second transmission filter that can be used for simultaneous transmission are integrated into one chip and configured as one electronic component, heat dissipation may be reduced and characteristics may be reduced.

An aspect of the present disclosure is to provide a radio-frequency module and a communication device capable of improving heat dissipation.

Solutions to Problems

A radio-frequency module according to one aspect of the present disclosure includes a mounting substrate and an electronic component. The mounting substrate has a first main surface and on an opposite side as a second main surface. The electronic component is mounted on the first main surface of the mounting substrate. The electronic component includes a first transmission filter, a second transmission filter, a first input terminal and a first output terminal, and a second input terminal and a second output terminal. The first transmission filter has a pass band including a transmission band of a first communication band. The second transmission filter has a pass band including a transmission band of a second communication band. The first input terminal and the first output terminal are respectively connected to an input end and an output end of a signal path of the first transmission filter. The second input terminal and the second output terminal are respectively connected to an input end and an output end of a signal path of the second transmission filter. The first transmission filter includes a first substrate. The second transmission filter includes a second substrate. The first substrate and the second substrate may be common. The first communication band and the second communication band are communication bands available for simultaneous communication. The electronic component further includes a metallic member at ground potential. In the electronic component, the metallic member is arranged at least at one of between the first input terminal and the second input terminal and between the first output terminal and the second output terminal in a side view.

A radio-frequency module according to another aspect of the present disclosure includes a mounting substrate and an electronic component. The mounting substrate has a first main surface and on an opposite side as a second main surface. The electronic component is mounted on the first main surface of the mounting substrate. The electronic component includes a first transmission filter, a second transmission filter, a first input terminal and a first output terminal, and a second input terminal and a second output terminal. The first transmission filter has a pass band including a transmission band of a first communication band. The second transmission filter has a pass band including a transmission band of a second communication band. The first input terminal and the first output terminal are respectively connected to an input end and an output end of a signal path of the first transmission filter. The second input terminal and the second output terminal are respectively connected to an input end and an output end of a signal path of the second transmission filter. The first transmission filter includes a first substrate and a first functional electrode. The first functional electrode is provided on the first substrate and is connected to the first input terminal. The second transmission filter includes a second substrate and a second functional electrode. The second functional electrode is provided on the second substrate and is connected to the second input terminal. The first substrate and the second substrate may be common. The first communication band and the second communication band are communication bands available for simultaneous communication. The electronic component further includes a metallic member at ground potential. In the electronic component, the metallic member is arranged between the first functional electrode and the second functional electrode in a side view.

A communication device according to one aspect of the present disclosure includes the radio-frequency module according to the one aspect described above or the other aspect described above and a signal processing circuit. The signal processing circuit is connected to the radio-frequency module.

Advantageous Effects of Disclosure

In the radio-frequency module and the communication device according to the above-described aspects of the present disclosure, it is possible to improve heat dissipation.

DESCRIPTION OF EMBODIMENTS

Each of FIG. 2 to FIG. 11 referred to in the following embodiments and the like is a schematic diagram, and the ratios of the size and thickness of each constituent element in the diagram does not necessarily reflect the actual dimensional ratio.

Embodiment (1) Overview

Figure 2:
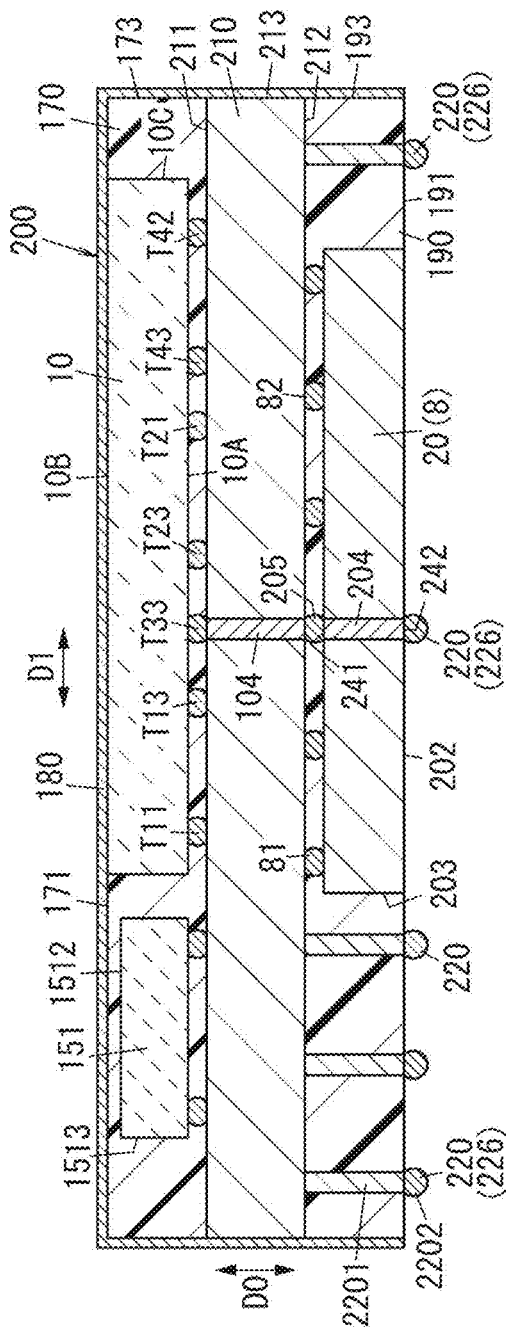
FIG. 2 is a cross-sectional view of the above radio-frequency module.
Figure 3:
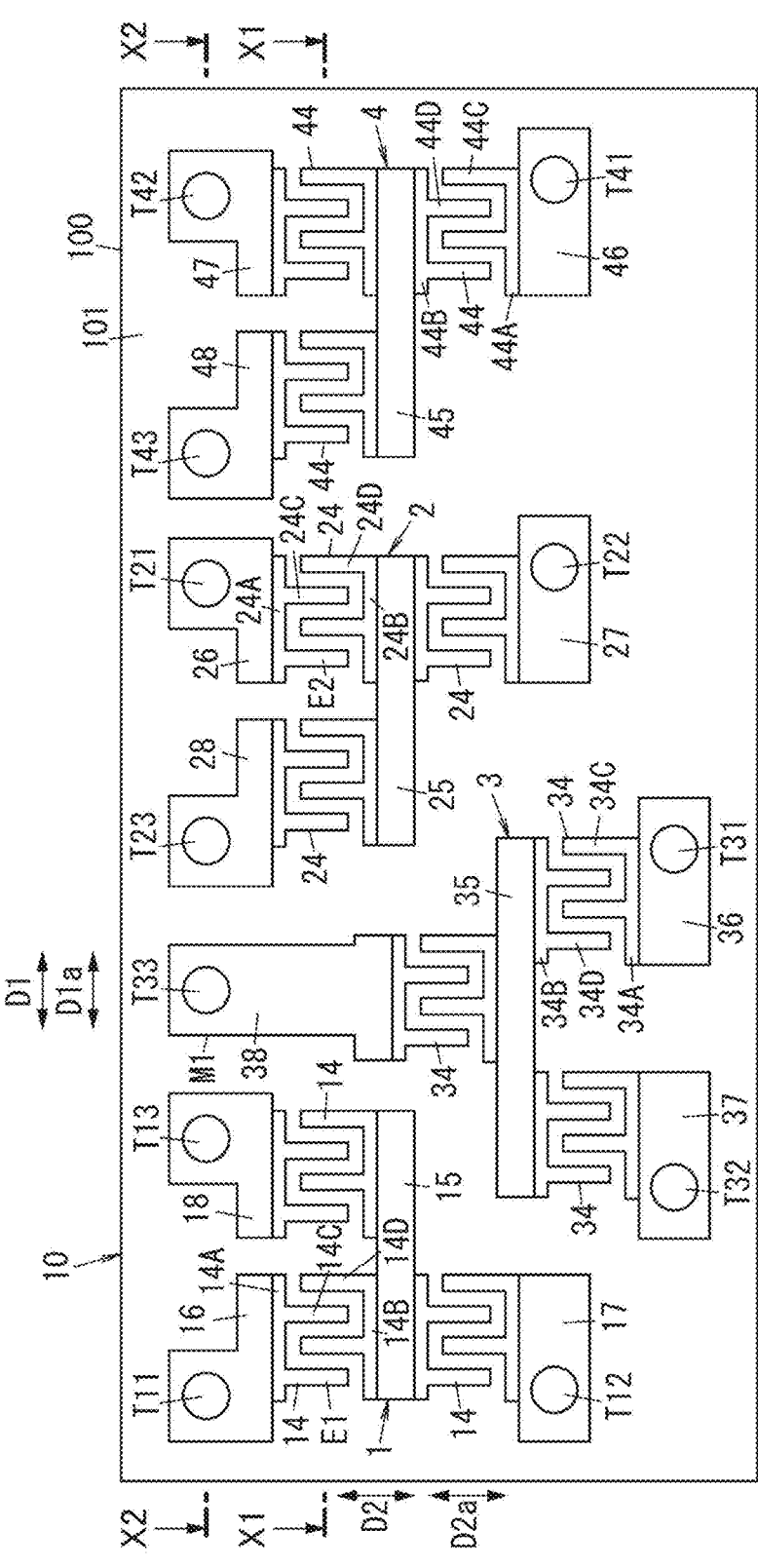
FIG. 3 is a plan view of an electronic component in the above radio-frequency module.

As illustrated in FIG. 2, a radio-frequency module 200 according to an embodiment includes a mounting substrate 210 and an electronic component 10. Sometimes the term "high-frequency" may be used in this disclosure, but it is a general term meaning radio-frequency, and is not limited to the HF band within the RF spectrum. The mounting substrate 210 has a first main surface 211 and a second main surface 212 facing each other. While the term "facing each other" is used it is intended to mean the surfaces are on opposite sides of the mounting substrate. The electronic component 10 is mounted on the first main surface 211 of the mounting substrate 210. The electronic component 10 has a main surface 10A on the mounting substrate 210 side, a main surface 10B on the opposite side to the mounting substrate 210 side, and an outer peripheral surface 10C. As illustrated in FIG. 3, the electronic component 10 includes a first transmission filter 1, a second transmission filter 2, a first input terminal T11 and a first output terminal T12, and a second input terminal T21 and a second output terminal T22. The first transmission filter 1 has a pass band including the transmission band of a first communication band. The second transmission filter 2 has a pass band including the transmission band of a second communication band. The first communication band and the second communication band are communication bands available for simultaneous communication. In the radio-frequency module 200 according to the embodiment, the second communication band is a communication band different from the first communication band. The term "radio-frequency module", or "RF module", as used herein refers to a module used for communication of a radio-frequency signal and includes a mounting substrate and at least one electronic component mounted on the mounting substrate.

As illustrated in FIG. 3, the first input terminal T11 and the first output terminal T12 are connected to the input end and the output end of the signal path of the first transmission filter 1, respectively. In addition, the second input terminal T21 and the second output terminal T22 are connected to the input end and the output end of the signal path of the second transmission filter 2, respectively. The first transmission filter 1 includes a first substrate (substrate 100). The second transmission filter 2 includes a second substrate (substrate 100). In the electronic component 10, the first substrate and the second substrate are common. In other words, in the electronic component 10, the first substrate and the second substrate are the same substrate 100. The electronic component 10 further includes a metallic member M1 at ground potential. In the electronic component 10, the metallic member M1 is arranged between the first input terminal T11 and the second input terminal T21 in a side view. More specifically, in the electronic component 10, the metallic member M1 is arranged between the first input terminal T11 and the second input terminal T21 in a side view from a second direction D2 orthogonal to a first direction D1 in which the first input terminal T11 and the second input terminal T21 are arranged and a thickness direction D0 of the mounting substrate 210 (see FIG. 2). Thus, in the radio-frequency module 200 according to the embodiment, heat generated in each of the first transmission filter 1 and the second transmission filter 2 (FIG. 1, and FIG. 3) can be dissipated through the metallic member M1, and heat dissipation can be improved.

In addition, as illustrated in FIG. 2, the radio-frequency module 200 further includes a resin layer 170 and a shield layer 180. The shield layer 180 is arranged on the first main surface 211 of the mounting substrate 210 and covers an outer peripheral surface 10C of the electronic component 10. The shield layer 180 covers the resin layer 170 and overlaps at least a part of the electronic component 10 in plan view from the thickness direction D0 of the mounting substrate 210. The shield layer 180 is in contact with a main surface 10B of the electronic component 10 on the side opposite to the mounting substrate 210 side.

In addition, the radio-frequency module 200 further includes a second electronic component 20 different from the electronic component 10 (hereinafter also referred to as a first electronic component 10). The second electronic component 20 is mounted on the second main surface 212 of the mounting substrate 210.

Hereinafter, the radio-frequency module 200 and a communication device 300 according to the embodiment will be described in more detail with reference to FIG. 1 to FIG. 5.

(2) Radio-Frequency Module and Communication Device (2.1) Circuit Configuration of Radio-Frequency Module and Communication Device Circuit configurations of the radio-frequency module 200 and the communication device 300 according to an embodiment will be described with reference to FIG. 1.

The radio-frequency module 200 is used in, for example, the communication device 300. The communication device 300 is, for example, a mobile phone (for example, a smartphone), but is not limited thereto, and may be, for example, a wearable terminal (for example, a smart watch). The radio-frequency module 200 is a module compatible with, for example, the fourth generation mobile communication (4G) standard, the fifth generation mobile communication (5G) standard, or the like. The 4G standard is, for example, the Third Generation Partnership Project (3GPP) Long Term Evolution (LTE) standard. The 5G standard is, for example, 5G New Radio (NR). The radio-frequency module 200 is, for example, a module capable of supporting carrier aggregation and dual connectivity. The radio-frequency module 200 is also capable of supporting two uplink carrier aggregation that simultaneously uses two frequency bands in uplink.

For example, the radio-frequency module 200 is configured to amplify a transmission signal input from a signal processing circuit 301 and output the amplified transmission signal to an antenna 310. In addition, the radio-frequency module 200 is configured to amplify a reception signal input from the antenna 310 and output the amplified reception signal to the signal processing circuit 301. The signal processing circuit 301 is not a constituent element of the radio-frequency module 200 but a constituent element of the communication device 300 including the radio-frequency module 200. The radio-frequency module 200 according to the embodiment is controlled by, for example, the signal processing circuit 301 included in the communication device 300. The communication device 300 includes the radio-frequency module 200 and the signal processing circuit 301. The communication device 300 further includes the antenna 310. The communication device 300 further includes a circuit board on which the radio-frequency module 200 is mounted. The circuit board is, for example, a printed wiring board. The circuit board includes a ground electrode to which ground potential is applied.

The signal processing circuit 301 includes, for example, an RF signal processing circuit 302 and a baseband signal processing circuit 303. The RF signal processing circuit 302 is, for example, a radio frequency integrated circuit (RFIC) and performs signal processing on a radio-frequency signal. For example, the RF signal processing circuit 302 performs signal processing such as up-conversion on a radio-frequency signal (transmission signal) output from the baseband signal processing circuit 303, and outputs the radio-frequency signal on which the signal processing has been performed. In addition, for example, the RF signal processing circuit 302 performs signal processing such as down-conversion on a radio-frequency signal (reception signal) output from the radio-frequency module 200 and outputs the radio-frequency signal on which the signal processing has been performed to the baseband signal processing circuit 303. The baseband signal processing circuit 303 is, for example, a baseband integrated circuit (BBIC). The baseband signal processing circuit 303 generates an I-phase signal and a Q-phase signal from the baseband signal. The baseband signal is, for example, an audio signal, an image signal, or the like input from the outside. The baseband signal processing circuit 303 performs IQ modulation processing by combining the I-phase signal and the Q-phase signal, and outputs a transmission signal. At this time, the transmission signal is generated as a modulated signal (IQ signal) obtained by amplitude-modulating a carrier signal having a predetermined frequency with a period longer than the period of the carrier signal. The reception signal processed by the baseband signal processing circuit 303 is used, for example, as an image signal for image display or as an audio signal for a call of the user of the communication device 300. The radio-frequency module 200 transmits radio-frequency signals (reception signals, transmission signals) between the antenna 310 and the RF signal processing circuit 302 of the signal processing circuit 301.

The radio-frequency module 200 includes a plurality of (for example, four) transmission filters (the first transmission filter 1, the second transmission filter 2, a third transmission filter 5, and a fourth transmission filter 6) and a plurality of (for example, two) reception filters (a first reception filter 3 and a second reception filter 4). In addition, the radio-frequency module 200 includes a plurality of (for example, two) power amplifiers (a first power amplifier 151 and a second power amplifier 152). In addition, the radio-frequency module 200 includes a plurality of (for example, two) low noise amplifiers (a first low noise amplifier 161 and a second low noise amplifier 162). In addition, the radio-frequency module 200 includes a switch 8 (hereinafter, also referred to as a first switch 8) and a second switch 9.

In addition, the radio-frequency module 200 includes a plurality of external connection terminals 220. The plurality of external connection terminals 220 include an antenna terminal 221, a first signal input terminal 222, a second signal input terminal 223, a first signal output terminal 224, a second signal output terminal 225, and a plurality of ground terminals 226 (see FIG. 2). The plurality of ground terminals 226 are terminals that are electrically connected to a ground electrode of the above-described circuit board included in the communication device 300 and are supplied with ground potential. The metallic member M1 (see FIG. 2) is connected to a terminal (ground terminal 226) to which ground potential is applied. The metallic member M1 at ground potential means a metallic member connected to a terminal to which ground potential is applied.

Hereinafter, the circuit configuration of the radio-frequency module 200 will be described in more detail.

The first transmission filter 1, the second transmission filter 2, the third transmission filter 5, and the fourth transmission filter 6 are transmission filters that have pass bands with frequency bands different from each other. The first transmission filter 1 has a pass band including a transmission band of the first communication band. The second transmission filter 2 has a pass band including a transmission band of the second communication band different from the first communication band. The third transmission filter 5 has a pass band including a transmission band of a third communication band different from the first communication band and the second communication band. The fourth transmission filter 6 has a pass band including a transmission band of a fourth communication band different from the first communication band, the second communication band, and the third communication band. The first communication band is, for example, Band 1 of the 3GPP LTE standard or n1 of the 5G NR standard. Therefore, the transmission band of the first communication band is 1920 MHz to 1980 MHz. The second communication band is, for example, Band 3 of the 3GPP LTE standard or n3 of the 5G NR standard. Therefore, the transmission band of the second communication band is 1710 MHz to 1785 MHz. The third communication band is, for example, Band 39 of the 3GPP LTE standard. Therefore, the transmission band of the third communication band is 1880 MHz to 1920 MHz. The fourth communication band is, for example, Band 34 of the 3GPP LTE standard. Therefore, the transmission band of the fourth communication band is 2010 MHz to 2025 MHz. The first communication band and the second communication band are communication bands used for communication corresponding to frequency division duplex (FDD) as a communication scheme. Therefore, in the communication device 300, for example, FDD communication using the first transmission filter 1 and the second transmission filter 2 can be performed. The third communication band and the fourth communication band are communication bands used for communication corresponding to time division duplex (TDD) as a communication scheme. The third communication band and the fourth communication band are not limited to communication bands used for communication corresponding to TDD, and may be communication bands used for communication corresponding to FDD, for example.

The first reception filter 3 and the second reception filter 4 are reception filters that have pass bands with frequency bands different from each other. The first reception filter 3 has a pass band including a reception band of the first communication band. The second reception filter 4 has a pass band including a reception band of the second communication band. The first communication band is, for example, Band 1 of the 3GPP LTE standard or n1 of the 5G NR standard. Therefore, the reception band of the first communication band is 2110 MHz to 2170 MHz. The second communication band is, for example, Band 3 of the 3GPP LTE standard or n3 of the 5G NR standard. Therefore, the reception band of the second communication band is 1805 MHz to 1880 MHz.

The first power amplifier 151 has an input terminal and an output terminal. The first power amplifier 151 amplifies a transmission signal input to the input terminal of the first power amplifier 151 and outputs the amplified transmission signal from the output terminal of the first power amplifier 151. The input terminal of the first power amplifier 151 is connected to the first signal input terminal 222. The input terminal of the first power amplifier 151 is connected to the signal processing circuit 301 via the first signal input terminal 222. The first signal input terminal 222 is a terminal for inputting a radio-frequency signal (transmission signal) from an external circuit (for example, the signal processing circuit 301) to the radio-frequency module 200. The output terminal of the first power amplifier 151 is connected to a first terminal 80A of the switch 8 and is connectable to the first transmission filter 1, the third transmission filter 5, and the fourth transmission filter 6 via the switch 8. The first power amplifier 151 is a power amplifier capable of amplifying a radio-frequency signal in the pass band of the first transmission filter 1, a radio-frequency signal in the pass band of the third transmission filter 5, and a radio-frequency signal in the pass band of the fourth transmission filter 6. The first power amplifier 151 is, for example, a multistage amplifier including a driver stage amplifier and a final stage amplifier. In the first power amplifier 151, an input terminal of the driver stage amplifier is connected to the first signal input terminal 222, an output terminal of the driver stage amplifier is connected to an input terminal of the final stage amplifier, and an output terminal of the final stage amplifier is connected to the first terminal 80A of the switch 8. The first power amplifier 151 is not limited to a multistage amplifier and may be, for example, an in-phase combined amplifier or a differential combined amplifier.

The second power amplifier 152 has an input terminal and an output terminal. The second power amplifier 152 amplifies a transmission signal input to the input terminal of the second power amplifier 152 and outputs the amplified transmission signal from the output terminal of the second power amplifier 152. The input terminal of the second power amplifier 152 is connected to the second signal input terminal 223. The input terminal of the second power amplifier 152 is connected to the signal processing circuit 301 via the second signal input terminal 223. The second signal input terminal 223 is a terminal for inputting a radio-frequency signal (transmission signal) from an external circuit (for example, the signal processing circuit 301) to the radio-frequency module 200. The output terminal of the second power amplifier 152 is connected to a second terminal 80B of the switch 8 and is connectable to the second transmission filter 2, the third transmission filter 5, and the fourth transmission filter 6 via the switch 8. The second power amplifier 152 is a power amplifier capable of amplifying a radio-frequency signal in the pass band of the second transmission filter 2, a radio-frequency signal in the pass band of the third transmission filter 5, and a radio-frequency signal in the pass band of the fourth transmission filter 6. The second power amplifier 152 is, for example, a multistage amplifier including a driver stage amplifier and a final stage amplifier. In the second power amplifier 152, an input terminal of the driver stage amplifier is connected to the second signal input terminal 223, an output terminal of the driver stage amplifier is connected to an input terminal of the final stage amplifier, and an output terminal of the final stage amplifier is connected to the second terminal BOB of the switch 8. The second power amplifier 152 is not limited to a multistage amplifier and may be, for example, an in-phase combined amplifier or a differential combined amplifier.

The first power amplifier 151 and the second power amplifier 152 correspond to power classes different from each other. The "power class" is a classification (User Equipment Power Class) of output power of a terminal (communication device 300) defined by maximum output power or the like, and indicates that a smaller number described next to the "power class" corresponds to a higher output power. For example, the maximum output power (29 dBm) of power class 1 is greater than the maximum output power (26 dBm) of power class 2, and the maximum output power (26 dBm) of power class 2 is greater than the maximum output power (23 dBm) of power class 3. The measurement of the maximum output power is performed, for example, by a method defined by 3GPP or the like. The first power amplifier 151 corresponds to a first power class (for example, power class 2), and the second power amplifier 152 corresponds to a second power class (for example, power class 3) whose maximum output power is smaller than that of the first power class. The radio-frequency module 200 may further include a controller. For example, the controller controls the first power amplifier 151 and the second power amplifier 152 in accordance with a control signal from the signal processing circuit 301.

The radio-frequency module 200 may include a first output matching circuit provided in a signal path between the output terminal of the first power amplifier 151 and the first terminal 80A of the switch 8, and a second output matching circuit provided between the output terminal of the second power amplifier 152 and the second terminal 80B of the switch 8. The first output matching circuit is a circuit for impedance matching between the first power amplifier 151 and the first transmission filter 1, and includes, for example, a plurality of inductors and a plurality of capacitors. The second output matching circuit is a circuit for impedance matching between the second power amplifier 152 and the second transmission filter 2, and includes, for example, a plurality of inductors and a plurality of capacitors.

The first low noise amplifier 161 has an input terminal and an output terminal. The first low noise amplifier 161 amplifies a reception signal input to the input terminal of the first low noise amplifier 161, and outputs the amplified reception signal from the output terminal of the first low noise amplifier 161. The input terminal of the first low noise amplifier 161 is connected to the first reception filter 3. The input terminal of the first low noise amplifier 161 may be connected to the first reception filter 3 via a first input matching circuit including a first inductor. The first input matching circuit is a circuit for impedance matching between the first low noise amplifier 161 and the first reception filter 3. The output terminal of the first low noise amplifier 161 is connected to the first signal output terminal 224. The output terminal of the first low noise amplifier 161 is connected to the signal processing circuit 301 via the first signal output terminal 224, for example. The first signal output terminal 224 is a terminal for outputting the radio-frequency signal (reception signal) from the first low noise amplifier 161 to an external circuit (for example, the signal processing circuit 301).

The second low noise amplifier 162 has an input terminal and an output terminal. The second low noise amplifier 162 amplifies a reception signal input to the input terminal of the second low noise amplifier 162, and outputs the amplified reception signal from the output terminal of the second low noise amplifier 162. The input terminal of the second low noise amplifier 162 is connected to the second reception filter 4. The input terminal of the second low noise amplifier 162 may be connected to the second reception filter 4 via a second input matching circuit including a second inductor. The second input matching circuit is a circuit for impedance matching between the second low noise amplifier 162 and the second reception filter 4. The output terminal of the second low noise amplifier 162 is connected to the signal processing circuit 301 via the second signal output terminal 225, for example.

The second signal output terminal 225 is a terminal for outputting the radio-frequency signal (reception signal) from the second low noise amplifier 162 to an external circuit (for example, the signal processing circuit 301).

The first switch 8 includes the first terminal 80A, the second terminal 80B, a first selection terminal 81 connectable to the first terminal 80A, and a second selection terminal 82 connectable to the second terminal SOB. In addition, the first switch 8 further includes a third selection terminal 83 connectable to the first terminal 80A and a fourth selection terminal 84 connectable to the first terminal 80A. In the first switch 8, the first terminal 80A is connected to the output terminal of the first power amplifier 151. In addition, in the first switch 8, the second terminal 80B is connected to the output terminal of the second power amplifier 152. In addition, in the first switch 8, the first selection terminal 81 is connected to the first transmission filter 1. In addition, in the first switch 8, the second selection terminal 82 is connected to the second transmission filter 2. In addition, in the first switch 8, the third selection terminal 83 is connected to the third transmission filter 5. In addition, in the first switch 8, the fourth selection terminal 84 is connected to the fourth transmission filter 6. The first switch 8 is, for example, a switch capable of simultaneously performing connection between the first terminal 80A and the first selection terminal 81 and connection between the second terminal 80B and the second selection terminal 82. In addition, the first switch 8 is a switch capable of selectively connecting the first terminal 80A to one of the first selection terminal 81, the third selection terminal 83, and the fourth selection terminal 84.

The first switch 8 is controlled by, for example, the signal processing circuit 301. In this case, the first switch 8 switches the connection state between the first and second terminals 80A and 80B and the four selection terminals (the first selection terminal 81, the second selection terminal 82, the third selection terminal 83, and the fourth selection terminal 84) according to the control signal from the RF signal processing circuit 302 of the signal processing circuit 301. The first switch 8 is, for example, a switch integrated circuit (IC).

The second switch 9 includes a common terminal 90 and a plurality of (for example, two) selection terminals 91 and 92. In the second switch 9, the common terminal 90 is connected to the antenna terminal 221. In the radio-frequency module 200, the common terminal 90 and the antenna terminal 221 are connected to each other not via another circuit element, but not limited thereto, and may be connected to each other via, for example, a low pass filter and a coupler. The selection terminal 91 is connected to a connection point between the first transmission filter 1, the second transmission filter 2, the first reception filter 3, and the second reception filter 4. The second switch 9 is, for example, a switch capable of connecting one or more of the two selection terminals 91 and 92 to the common terminal 90. Here, the second switch 9 is, for example, a switch capable of one-to-one and one-to-many connections.

The second switch 9 is controlled by, for example, the signal processing circuit 301. The second switch 9 switches the connection state between the common terminal 90 and the two selection terminals 91 and 92 in accordance with a control signal from the RF signal processing circuit 302 of the signal processing circuit 301. The second switch 9 is, for example, a switch IC.

(2.2) Structure of Radio-Frequency Module

As illustrated in FIG. 2, the radio-frequency module 200 includes the mounting substrate 210, the first electronic component 10, and the second electronic component 20. As illustrated in FIG. 3, the first electronic component 10 includes the first transmission filter 1, the second transmission filter 2, the first reception filter 3, and the second reception filter 4. The second electronic component 20 includes the first switch 8. In addition, the radio-frequency module 200 includes the first power amplifier 151 and the second power amplifier 152 (see FIG. 1). In addition, the radio-frequency module 200 includes the first low noise amplifier 161 and the second low noise amplifier 162. In addition, the radio-frequency module 200 includes the second switch 9 (see FIG. 1). In addition, the radio-frequency module 200 includes the plurality of external connection terminals 220 (see FIG. 1 and FIG. 2). In addition, the radio-frequency module 200 includes the resin layer 170 (hereinafter also referred to as a first resin layer 170), the shield layer 180, and a second resin layer 190.

The mounting substrate 210 has the first main surface 211 and the second main surface 212 facing each other in the thickness direction D0 of the mounting substrate 210. The mounting substrate 210 is, for example, a multilayer substrate including a plurality of dielectric layers and a plurality of conductive layers. The plurality of dielectric layers and the plurality of conductive layers are stacked in the thickness direction D0 of the mounting substrate 210. The plurality of conductive layers are formed in a predetermined pattern determined for each layer. Each of the plurality of conductive layers includes one or more conductor portions in one plane orthogonal to the thickness direction D0 of the mounting substrate 210. The material of each conductive layer is, for example, copper. The plurality of conductive layers include a ground layer. In the radio-frequency module 200, the plurality of ground terminals 226 and the ground layer are electrically connected to each other through via conductors or the like included in the mounting substrate 210. The mounting substrate 210 is a low temperature co-fired ceramics (LTCC) substrate, for example. The mounting substrate 210 is not limited to the LTCC substrate and may be, for example, a printed wiring board, a high temperature co-fired ceramics (HTCC) substrate, or a resin multilayer substrate. In plan view from the thickness direction D0 of the mounting substrate 210, the outer edge of the mounting substrate 210 has a quadrangular shape.

In addition, the mounting substrate 210 is not limited to the LTCC substrate and may be, for example, a wiring structure. The wiring structure is, for example, a multilayer structure. The multilayer structure includes at least one insulating layer and at least one conductive layer. The insulating layer is formed in a predetermined pattern. Under a condition there are a plurality of insulating layers, the plurality of insulating layers are formed in a predetermined pattern determined for each layer. The conductive layer is formed in a predetermined pattern different from the predetermined pattern of the insulating layer. Under a condition there are a plurality of conductive layers, the plurality of conductive layers are formed in a predetermined pattern determined for each layer. The conductive layer may include one or more redistribution portions. In the wiring structure, the first surface of two surfaces facing each other in the thickness direction of the multilayer structure is the first main surface 211 of the mounting substrate 210, and the second surface is the second main surface 212 of the mounting substrate 210. The wiring structure may be, for example, an interposer. The interposer may be an interposer using a silicon substrate or may be a substrate formed of multiple layers.

The first main surface 211 and the second main surface 212 of the mounting substrate 210 are separated from each other in the thickness direction D0 of the mounting substrate 210, and intersect the thickness direction D0 of the mounting substrate 210. The first main surface 211 of the mounting substrate 210 is, for example, orthogonal to the thickness direction D0 of the mounting substrate 210, but may include, for example, a side surface or the like of the conductor portion as a surface not orthogonal to the thickness direction D0. In addition, the second main surface 212 of the mounting substrate 210 is, for example, orthogonal to the thickness direction D0 of the mounting substrate 210, but may include, for example, a side surface or the like of the conductor portion as a surface not orthogonal to the thickness direction D0. In addition, the first main surface 211 and the second main surface 212 of the mounting substrate 210 may be formed with fine irregularities, concave portions, or convex portions.

In the radio-frequency module 200, a plurality of first circuit components are mounted on the first main surface 211 of the mounting substrate 210. The plurality of first circuit components include the first electronic component 10, the first power amplifier 151, and the second power amplifier 152. "The first circuit component is mounted on the first main surface 211 of the mounting substrate 210" includes a case where the first circuit component is arranged on (mechanically connected to) the first main surface 211 of the mounting substrate 210 and a case where the first circuit component is electrically connected to (an appropriate conductor portion of) the mounting substrate 210.

In the radio-frequency module 200, a plurality of second circuit components are mounted on the second main surface 212 of the mounting substrate 210. The plurality of second circuit components include the second electronic component 20, the second switch 9 (see FIG. 1), the first low noise amplifier 161 (see FIG. 1), and the second low noise amplifier 162 (see FIG. 1). The meaning of the term "the second circuit component is mounted on the second main surface 212 of the mounting substrate 210" includes a case where the second circuit component is arranged on (mechanically connected to) the second main surface 212 of the mounting substrate 210 and a case where the second circuit component is electrically connected to (an appropriate conductor portion of) the mounting substrate 210.

As illustrated in FIG. 3, the first electronic component 10 includes the first transmission filter 1, the second transmission filter 2, the first reception filter 3, and the second reception filter 4. The first electronic component 10 is mounted on the first main surface 211 of the mounting substrate 210. In plan view from the thickness direction D0 of the mounting substrate 210, the outer edge of the first electronic component 10 has a rectangular shape. The first electronic component 10 will be described in more detail in the section of "(2.3) Structure of First Electronic Component".

The third transmission filter 5 (see FIG. 1) is mounted on the first main surface 211 of the mounting substrate 210. The third transmission filter 5 is an acoustic wave filter. The acoustic wave filter is, for example, a surface acoustic wave filter using a surface acoustic wave. In plan view from the thickness direction D0 of the mounting substrate 210, the outer edge of the third transmission filter 5 has a quadrangular shape.

The fourth transmission filter 6 (see FIG. 1) is mounted on the first main surface 211 of the mounting substrate 210. The fourth transmission filter 6 is an acoustic wave filter. The acoustic wave filter is, for example, a surface acoustic wave filter using a surface acoustic wave. In plan view from the thickness direction D0 of the mounting substrate 210, the outer edge of the fourth transmission filter 6 has a quadrangular shape.

Each of the first power amplifier 151 and the second power amplifier 152 is a power amplification IC chip. As described above, the first power amplifier 151 and the second power amplifier 152 are mounted on the first main surface 211 of the mounting substrate 210. The outer edge of each of the first power amplifier 151 and the second power amplifier 152 has a quadrangular shape in plan view from the thickness direction D0 of the mounting substrate 210.

Each of the driver stage amplifier and the final stage amplifier of the first power amplifier 151 includes an amplification transistor. The amplification transistor is, for example, a heterojunction bipolar transistor (HBT). The amplification transistor is not limited to the HBT but may be a bipolar transistor or a field effect transistor (FET). The FET is, for example, a metal-oxide-semiconductor field effect transistor (MOSFET).

Each of the driver stage amplifier and the final stage amplifier of the second power amplifier 152 includes an amplification transistor. The amplification transistor is, for example, the HBT. The amplification transistor is not limited to the HBT, but may be the bipolar transistor or the FET. The FET is, for example, the MOSFET.

The second electronic component 20 including the first switch 8 is mounted on the second main surface 212 of the mounting substrate 210. In plan view from the thickness direction D0 of the mounting substrate 210, the outer edge of the second electronic component 20 has a quadrangular shape. The second electronic component 20 includes the first terminal 80A, the second terminal 80B, the first selection terminal 81, the second selection terminal 82, the third selection terminal 83, and the fourth selection terminal 84 as the plurality of external terminals. Each of the plurality of external terminals is a bump. The second electronic component 20 is flip-chip mounted on the second main surface 212 of the mounting substrate 210.

The IC chip including the first low noise amplifier 161 and the second low noise amplifier 162 is mounted on the second main surface 212 of the mounting substrate 210. In addition, the second switch 9 is mounted on the second main surface 212 of the mounting substrate 210.

As illustrated in FIG. 2, the plurality of external connection terminals 220 are arranged on the second main surface 212 of the mounting substrate 210. "The external connection terminal 220 is arranged on the second main surface 212 of the mounting substrate 210" includes a case where the external connection terminal 220 is mechanically connected to the second main surface 212 of the mounting substrate 210 and a case where the external connection terminal 220 is electrically connected to (an appropriate conductor portion of) the mounting substrate 210.

Figure 1:
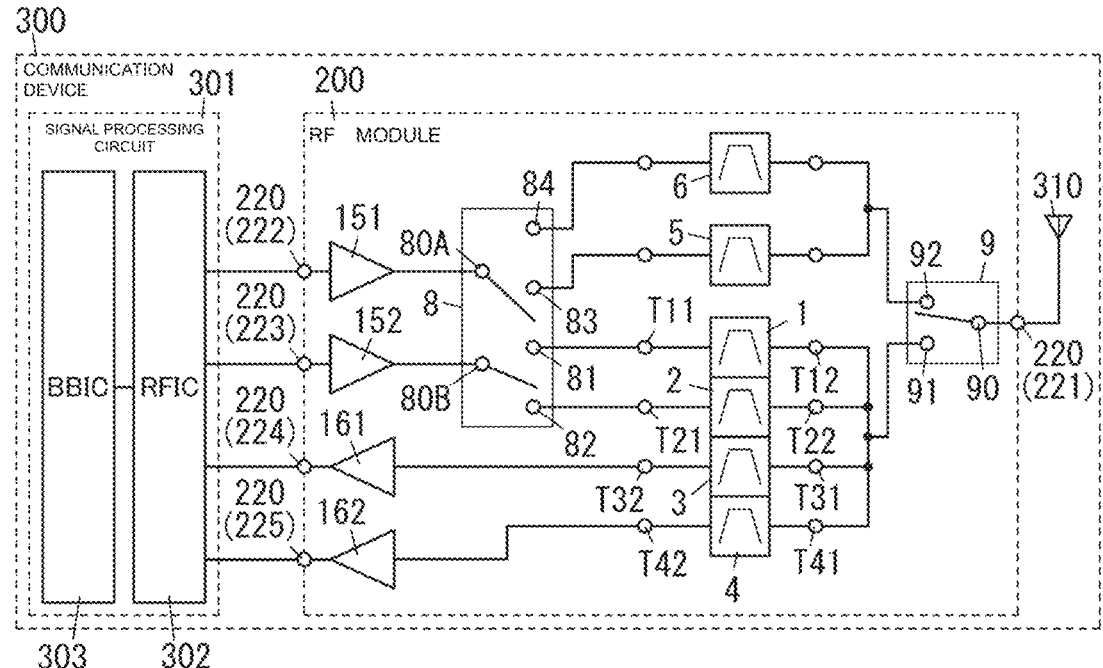
FIG. 1 is a circuit configuration diagram of a communication device including a radio-frequency module according to Embodiment 1.

The plurality of external connection terminals 220 include the antenna terminal 221, the first signal input terminal 222, the second signal input terminal 223, the first signal output terminal 224, the second signal output terminal 225, and the plurality of ground terminals 226 (see FIG. 1). The plurality of ground terminals 226 are electrically connected to the ground layer of the mounting substrate 210. The ground layer is a circuit ground of the radio-frequency module 200, and the plurality of first circuit components and the plurality of second circuit components of the radio-frequency module 200 include circuit components electrically connected to the ground layer.

The material of the plurality of external connection terminals 220 is, for example, a metal (for example, copper, a copper alloy, or the like). Each of the plurality of external connection terminals 220 includes a columnar electrode 2201 and a bump 2202. The columnar electrode 2201 is, for example, a cylindrical electrode. The plurality of columnar electrodes 2201 are bonded to the conductor portion of the mounting substrate 210 by, for example, solder, but are not limited thereto, and may be bonded using, for example, a conductive adhesive (for example, conductive paste) or may be directly bonded. The bump 2202 is provided on an end surface of the columnar electrode 2201 on a side opposite to the mounting substrate 210 side. The bump 2202 has conductivity.

As illustrated in FIG. 2, the first resin layer 170 is arranged on the first main surface 211 of the mounting substrate 210. The first resin layer 170 includes resin (for example, epoxy resin). The first resin layer 170 may contain a filler in addition to the resin.

The first resin layer 170 covers the outer peripheral surface 10C of the first electronic component 10. The outer peripheral surface 10C of the first electronic component 10 includes four side surfaces connecting the main surface 10B on the side opposite to the mounting substrate 210 side and the main surface 10A on the mounting substrate 210 side in the first electronic component 10. In addition, the first resin layer 170 covers the outer peripheral surface of the third transmission filter 5 (see FIG. 1) and the outer peripheral surface of the fourth transmission filter 6 (see FIG. 1). In addition, the first resin layer 170 covers an outer peripheral surface 1513 of the first power amplifier 151 and a main surface 1512 of the first power amplifier 151 on a side opposite to the mounting substrate 210 side. In addition, the first resin layer 170 covers the outer peripheral surface of the second power amplifier 152 (see FIG. 1) and the main surface of the second power amplifier 152 on the side opposite to the mounting substrate 210 side.

The shield layer 180 covers the first resin layer 170. The shield layer 180 has conductivity. In the radio-frequency module 200, the shield layer 180 is provided for the purpose of electromagnetic shielding between the inside and outside of the radio-frequency module 200. The shield layer 180 has a multilayer structure in which a plurality of metallic layers are stacked, but is not limited thereto and may be a single metallic layer. The metallic layer contains one or more kinds of metals. Under a condition the shield layer 180 has a multilayer structure in which a plurality of metallic layers are stacked, it includes, for example, a first SUS layer (a first stainless-steel layer), a Cu layer on the first SUS layer, and a second SUS layer (a second stainless-steel layer) on the Cu layer. The materials of the first SUS layer and the second SUS layer are alloys containing Fe, Ni, and Cr. In addition, under a condition the shield layer 180 is a single metallic layer, it is, for example, a Cu layer. The shield layer 180 covers a main surface 171 of the first resin layer 170 on a side opposite to the mounting substrate 210 side, an outer peripheral surface 173 of the first resin layer 170, and an outer peripheral surface 213 of the mounting substrate 210. The shield layer 180 is in contact with at least a part of the outer peripheral surface of the ground layer of the mounting substrate 210. Thus, the potential of the shield layer 180 can be made equal to the potential of the ground layer.

The shield layer 180 covers the main surface 10B of the first electronic component 10 on the side opposite to the mounting substrate 210 side, the main surface of the third transmission filter 5 on the side opposite to the mounting substrate 210 side, and the main surface of the fourth transmission filter 6 on the side opposite to the mounting substrate 210 side. The shield layer 180 is in contact with the main surface 10B of the first electronic component 10 on the side opposite to the mounting substrate 210 side, the main surface of the third transmission filter 5 on the side opposite to the mounting substrate 210 side, and the main surface of the fourth transmission filter 6 on the side opposite to the mounting substrate 210 side. In the radio-frequency module 200, the shield layer 180 is in contact with the entire main surface 10B of the first electronic component 10 on the side opposite to the mounting substrate 210 side. In addition, the shield layer 180 is in contact with the entire main surface of the third transmission filter 5 on the side opposite to the mounting substrate 210 side. In addition, the shield layer 180 is in contact with the entire main surface of the fourth transmission filter 6 on the side opposite to the mounting substrate 210 side.

The second resin layer 190 covers an outer peripheral surface 203 of the second electronic component 20 mounted on the second main surface 212 of the mounting substrate 210, the outer peripheral surface of the second switch 9 (see FIG. 1), the outer peripheral surface of the IC chip, and the outer peripheral surface of the columnar electrode 2201 of each of the plurality of external connection terminals 220. The IC chip includes the first low noise amplifier 161 and the second low noise amplifier 162. The second resin layer 190 includes resin (for example, epoxy resin). The second resin layer 190 may contain a filler in addition to the resin. The material of the second resin layer 190 may be the same material as the material of the first resin layer 170 or may be a different material. The second resin layer 190 does not cover the main surface 202 of the second electronic component 20 on the side opposite to the mounting substrate 210 side. In addition, the second resin layer 190 does not cover the end portions (bumps 2202) of the plurality of external connection terminals 220 on the side opposite to the mounting substrate 210 side.

In the radio-frequency module 200, the shield layer 180 also covers an outer peripheral surface 193 of the second resin layer 190.

(2.3) Structure of First Electronic Component

As illustrated in FIG. 3, the first electronic component 10 includes the first transmission filter 1, the second transmission filter 2, the first reception filter 3, and the second reception filter 4. In addition, the first electronic component 10 includes the first input terminal T11 connected to the input end of the signal path of the first transmission filter 1, the first output terminal T12 connected to the output end of the signal path of the first transmission filter 1, and a first ground terminal T13 connected to the first transmission filter 1. In addition, the first electronic component 10 includes the second input terminal T21 connected to the input end of the signal path of the second transmission filter 2, the second output terminal T22 connected to the output end of the signal path of the second transmission filter 2, and a second ground terminal T23 connected to the second transmission filter 2. In addition, the first electronic component 10 includes a third input terminal T31 connected to the input end of the signal path of the first reception filter 3, a third output terminal T32 connected to the output end of the signal path of the first reception filter 3, and a third ground terminal T33 connected to the first reception filter 3. In addition, the first electronic component 10 includes a fourth input terminal T41 connected to the input end of the signal path of the second reception filter 4, a fourth output terminal T42 connected to the output end of the signal path of the second reception filter 4, and a fourth ground terminal T43 connected to the second reception filter 4. The first transmission filter 1 includes the first substrate (substrate 100). The second transmission filter 2 includes the second substrate (substrate 100). The first reception filter 3 includes a third substrate (substrate 100). The second reception filter 4 includes a fourth substrate (substrate 100). In the first electronic component 10, the first substrate, the second substrate, the third substrate, and the fourth substrate are common. In other words, in the first electronic component 10, the first substrate, the second substrate, the third substrate, and the fourth substrate are the same substrate 100. In plan view from the thickness direction D0 of the mounting substrate 210, the outer edge of the substrate 100 has a rectangular shape. In the first electronic component 10, the first transmission filter 1, the first reception filter 3, the second transmission filter 2, and the second reception filter 4 are arranged in order of the first transmission filter 1, the first reception filter 3, the second transmission filter 2, and the second reception filter 4 in the longitudinal direction of the substrate 100.

The first transmission filter 1 is a T-type filter including a plurality of (three) first resonators. More specifically, the first transmission filter 1 is a T-type filter including a plurality of first resonators and a first wiring portion 15 connecting the plurality of first resonators. The plurality of first resonators includes two series arm resonators and one parallel arm resonator. The first transmission filter 1 is, for example, an acoustic wave filter. In the acoustic wave filter, each of the plurality of first resonators is formed of an acoustic wave resonator. The acoustic wave filter is, for example, a surface acoustic wave filter using a surface acoustic wave. In the surface acoustic wave filter, each of the plurality of first resonators is, for example, a surface acoustic wave (SAW) resonator. The first transmission filter 1 is not limited to a T-type filter and may be, for example, a ladder filter.

The first substrate (substrate 100) is a piezoelectric substrate, for example, a lithium tantalate substrate or a lithium niobate substrate. The first transmission filter 1 has a plurality of interdigital transducer (IDT) electrodes 14 provided on the first substrate (substrate 100). The plurality of IDT electrodes 14 has conductivity. The material of the plurality of IDT electrodes 14 is, for example, aluminum (Al), copper (Cu), platinum (Pt), gold (Au), silver (Ag), titanium (Ti), nickel (Ni), chromium (Cr), molybdenum (Mo), tungsten (W), tantalum (Ta), magnesium (Mg), iron (Fe), or an alloy mainly containing any of these metals. In addition, the plurality of IDT electrodes 14 may have a structure in which a plurality of metallic films made of these metals or alloys are stacked. In addition, the plurality of IDT electrodes 14 include, for example, a stacked film of a first metallic film made of a Ti film formed on the substrate 100 and a second metallic film made of an Al film formed on the first metallic film. The first metallic film functions as a close contact film. The material of the first metallic film is Ti, but is not limited thereto, and may be, for example, Cr or NiCr. In addition, the material of the second metallic film is Al, but is not limited thereto, and may include Al and Cu, for example. The thickness of the first metallic film is thinner than the thickness of the second metallic film. In the first transmission filter 1, each of the plurality of IDT electrodes 14 is a component of a SAW resonator. The first wiring portion 15 is provided on the first substrate (substrate 100). The first wiring portion 15 connects the plurality of first resonators by connecting the plurality of IDT electrodes 14.

Each of the IDT electrodes 14 has a first busbar 14A, a second busbar 14B, a plurality of first electrode fingers 14C, and a plurality of second electrode fingers 14D. The second busbar 14B is opposed to the first busbar 14A. The plurality of first electrode fingers 14C are connected to the first busbar 14A and protrude from the first busbar 14A toward the second busbar 14B side. The plurality of first electrode fingers 14C are formed integrally with the first busbar 14A and are separated from the second busbar 14B. The plurality of second electrode fingers 14D are connected to the second busbar 14B and protrude from the second busbar 14B toward the first busbar 14A side. The plurality of second electrode fingers 14D are formed integrally with the second busbar 14B and are separated from the first busbar 14A. In the IDT electrode 14, the plurality of first electrode fingers 14C and the plurality of second electrode fingers 14D are arranged to be separated from each other in one direction (the first direction D1 in the example of FIG. 3) orthogonal to the thickness direction of the substrate 100. The plurality of first electrode fingers 14C and the plurality of second electrode fingers 14D are alternately arranged one by one to be separated from each other in the first direction D1, but are not limited thereto. The first busbar 14A is a conductor portion for setting the plurality of first electrode fingers 14C to the same potential (equipotential). The second busbar 14B is a conductor portion for setting the plurality of second electrode fingers 14D to the same potential. In the IDT electrode 14, the number of pairs of the first electrode fingers 14C and the second electrode fingers 14D is 100, as an example. In other words, the IDT electrode 14 has, as an example, 100 first electrode fingers 14C and 100 second electrode fingers 14D. Note that in FIG. 3 and FIG. 4, only two each of the first electrode fingers 14C and the second electrode fingers 14D are illustrated in order to make the drawings easy to see.

The second transmission filter 2 is a T-type filter including a plurality of (three) second resonators. More specifically, the second transmission filter 2 is a T-type filter including a plurality of second resonators and a second wiring portion 25 connecting the plurality of second resonators. The plurality of second resonators include two series arm resonators and one parallel arm resonator. The second transmission filter 2 is, for example, an acoustic wave filter. In the acoustic wave filter, each of the plurality of second resonators is formed of an acoustic wave resonator. The acoustic wave filter is, for example, a surface acoustic wave filter using a surface acoustic wave. In the surface acoustic wave filter, each of the plurality of second resonators is, for example, a SAW resonator. The second transmission filter 2 is not limited to a T-type filter and may be, for example, a ladder filter.

The second substrate (substrate 100) is a piezoelectric substrate, for example, a lithium tantalate substrate or a lithium niobate substrate. The second transmission filter 2 has a plurality of IDT electrodes 24 provided on the second substrate (substrate 100). The material of the plurality of IDT electrodes 24 is the same as the material of the plurality of IDT electrodes 14. In the second transmission filter 2, each of the plurality of IDT electrodes 24 is a component of a SAW resonator. The second wiring portion 25 is provided on the second substrate (substrate 100). The second wiring portion 25 connects the plurality of second resonators by connecting the plurality of IDT electrodes 24.

Each of the IDT electrodes 24 has a first busbar 24A, a second busbar 24B, a plurality of first electrode fingers 24C, and a plurality of second electrode fingers 24D. The second busbar 24B is opposed to the first busbar 24A. The plurality of first electrode fingers 24C are connected to the first busbar 24A and protrude from the first busbar 24A toward the second busbar 24B side. The plurality of first electrode fingers 24C are formed integrally with the first busbar 24A and are separated from the second busbar 24B. The plurality of second electrode fingers 24D are connected to the second busbar 24B and protrude from the second busbar 24B toward the first busbar 24A side. The plurality of second electrode fingers 24D are formed integrally with the second busbar 24B and are separated from the first busbar 24A. In the IDT electrode 24, the plurality of first electrode fingers 24C and the plurality of second electrode fingers 24D are arranged to be separated from each other in the first direction D1. The plurality of first electrode fingers 24C and the plurality of second electrode fingers 24D are alternately arranged one by one to be separated from each other in the first direction D1, but are not limited thereto. The first busbar 24A is a conductor portion for setting the plurality of first electrode fingers 24C to the same potential. The second busbar 24B is a conductor portion for setting the plurality of second electrode fingers 24D to the same potential. In the IDT electrode 24, the number of pairs of the first electrode fingers 24C and the second electrode fingers 24D is 100, as an example. In other words, the IDT electrode 24 has, as an example, 100 first electrode fingers 24C and 100 second electrode fingers 24D. Note that in FIG. 3 and FIG. 4, only two each of the first electrode fingers 24C and the second electrode fingers 24D are illustrated in order to make the drawings easy to see.

The first reception filter 3 is a T-type filter including a plurality of (three) third resonators. More specifically, the first reception filter 3 is a T-type filter including a plurality of third resonators and a third wiring portion 35 connecting the plurality of third resonators. The plurality of third resonators include two series arm resonators and one parallel arm resonator. The first reception filter 3 is, for example, an acoustic wave filter. In the acoustic wave filter, each of the plurality of third resonators is formed of an acoustic wave resonator. The acoustic wave filter is, for example, a surface acoustic wave filter using a surface acoustic wave. In the surface acoustic wave filter, each of the plurality of third resonators is, for example, a SAW resonator. The first reception filter 3 is not limited to a T-type filter and may be, for example, a ladder filter.

The third substrate (substrate 100) is a piezoelectric substrate and is, for example, a lithium tantalate substrate or a lithium niobate substrate. The first reception filter 3 has a plurality of IDT electrodes 34 provided on the third substrate (substrate 100). The material of the plurality of IDT electrodes 34 is the same as the material of the plurality of IDT electrodes 14. In the first reception filter 3, each of the plurality of IDT electrodes 34 is a component of a SAW resonator. The third wiring portion 35 is provided on the third substrate (substrate 100). The third wiring portion 35 connects the plurality of third resonators by connecting the plurality of IDT electrodes 34.

Each of the IDT electrodes 34 has a first busbar 34A, a second busbar 34B, a plurality of first electrode fingers 34C, and a plurality of second electrode fingers 34D. The second busbar 34B is opposed to the first busbar 34A. The plurality of first electrode fingers 34C are connected to the first busbar 34A and protrude from the first busbar 34A toward the second busbar 34B side. The plurality of first electrode fingers 34C are formed integrally with the first busbar 34A and are separated from the second busbar 34B. The plurality of second electrode fingers 34D are connected to the second busbar 34B and protrude from the second busbar 34B toward the first busbar 34A side. The plurality of second electrode fingers 34D are formed integrally with the second busbar 34B and are separated from the first busbar 34A. In the IDT electrode 34, the plurality of first electrode fingers 34C and the plurality of second electrode fingers 34D are arranged to be separated from each other in the first direction D1. The plurality of first electrode fingers 34C and the plurality of second electrode fingers 34D are alternately arranged one by one to be separated from each other in the first direction D1, but are not limited thereto. The first busbar 34A is a conductor portion for setting the plurality of first electrode fingers 34C to the same potential. The second busbar 34B is a conductor portion for setting the plurality of second electrode fingers 34D to the same potential. In the IDT electrode 34, the number of pairs of the first electrode finger 34C and the second electrode finger 34D is 100, as an example. In other words, the IDT electrode 34 has, as an example, 100 first electrode fingers 34C and 100 second electrode fingers 34D. Note that in FIG. 3, only two each of the first electrode fingers 34C and the second electrode fingers 34D are illustrated in order to make the drawings easy to see.

The second reception filter 4 is a T-type filter including a plurality of (three) fourth resonators. More specifically, the second reception filter 4 is a T-type filter including a plurality of fourth resonators and a fourth wiring portion 45 connecting the plurality of fourth resonators. The plurality of fourth resonators includes two series arm resonators and one parallel arm resonator. The second reception filter 4 is, for example, an acoustic wave filter. In the acoustic wave filter, each of the plurality of fourth resonators is formed of an acoustic wave resonator. The acoustic wave filter is, for example, a surface acoustic wave filter using a surface acoustic wave. In the surface acoustic wave filter, each of the plurality of fourth resonators is, for example, a SAW resonator. The second reception filter 4 is not limited to a T-type filter and may be, for example, a ladder filter.

The fourth substrate (substrate 100) is a piezoelectric substrate and is, for example, a lithium tantalate substrate or a lithium niobate substrate. The second reception filter 4 has a plurality of IDT electrodes 44 provided on the fourth substrate (substrate 100). The material of the plurality of IDT electrodes 44 is the same as the material of the plurality of IDT electrodes 14. In the second reception filter 4, each of the plurality of IDT electrodes 44 is a component of a SAW resonator. The fourth wiring portion 45 is provided on the fourth substrate (substrate 100). The fourth wiring portion 45 connects the plurality of fourth resonators by connecting the plurality of IDT electrodes 44.

Each of the IDT electrodes 44 has a first busbar 44A, a second busbar 44B, a plurality of first electrode fingers 44C, and a plurality of second electrode fingers 44D. The second busbar 44B is opposed to the first busbar 44A. The plurality of first electrode fingers 44C are connected to the first busbar 44A and protrude from the first busbar 44A toward the second busbar 44B side. The plurality of first electrode fingers 44C are formed integrally with the first busbar 44A and are separated from the second busbar 44B. The plurality of second electrode fingers 44D are connected to the second busbar 44B and protrude from the second busbar 44B toward the first busbar 44A side. The plurality of second electrode fingers 44D are formed integrally with the second busbar 44B and are separated from the first busbar 44A. In the IDT electrode 44, the plurality of first electrode fingers 44C and the plurality of second electrode fingers 44D are arranged to be separated from each other in the first direction D1. The plurality of first electrode fingers 44C and the plurality of second electrode fingers 44D are alternately arranged one by one to be separated from each other in the first direction D1, but are not limited thereto. The first busbar 44A is a conductor portion for setting the plurality of first electrode fingers 44C to the same potential. The second busbar 44B is a conductor portion for setting the plurality of second electrode fingers 44D to the same potential. In the IDT electrode 44, the number of pairs of the first electrode finger 44C and the second electrode finger 44D is 100, as an example. In other words, the IDT electrode 44 has, as an example, 100 first electrode fingers 44C and 100 second electrode fingers 44D. Note that in FIG. 3 and FIG. 4, only two each of the first electrode fingers 44C and the second electrode fingers 44D are illustrated in order to make the drawings easy to see.

The first input terminal T11 connected to the first transmission filter 1 is connected to the first selection terminal 81 of the first switch 8 (see FIG. 2) via the mounting substrate 210 (see FIG. 2). The first input terminal T11 is a terminal for inputting a radio-frequency signal to the first transmission filter 1. The first output terminal T12 connected to the first transmission filter 1 is connected to the selection terminal 91 of the second switch 9 (see FIG. 1) via the mounting substrate 210. The first output terminal T12 is a terminal for outputting the radio-frequency signal that has passed through the first transmission filter 1. In addition, the first ground terminal T13 connected to the first transmission filter 1 is connected to the ground layer of the mounting substrate 210. The first ground terminal T13 is a terminal that is connected to the ground layer of the mounting substrate 210 and has ground potential. The first electronic component 10 includes a first input wiring portion 16, a first output wiring portion 17, and a first ground wiring portion 18. The first input wiring portion 16 is provided on the substrate 100 and connects the first input terminal T11 and the first transmission filter 1. The first output wiring portion 17 is provided on the substrate 100 and connects the first output terminal T12 and the first transmission filter 1. The first ground wiring portion 18 is provided on the substrate 100 and connects the first ground terminal T13 and the first transmission filter 1. In the first electronic component 10, the IDT electrode 14 connected to the first input terminal T11 without interposing other IDT electrodes 14 among the plurality of IDT electrodes 14 constitutes a first functional electrode E1 connected to the first input terminal T11. The first functional electrode E1 is the IDT electrode 14 corresponding to the series arm resonator closest to the first switch 8 (see FIG. 1) in terms of circuit among the plurality of first resonators.

The second input terminal T21 connected to the second transmission filter 2 is connected to the second selection terminal 82 of the first switch 8 (see FIG. 1) via the mounting substrate 210 (see FIG. 2). The second input terminal T21 is a terminal for inputting a radio-frequency signal to the second transmission filter 2. The second output terminal T22 connected to the second transmission filter 2 is connected to the selection terminal 91 of the second switch 9 (see FIG. 1) via the mounting substrate 210. The second output terminal T22 is a terminal for outputting the radio-frequency signal that has passed through the second transmission filter 2. In addition, the second ground terminal T23 connected to the second transmission filter 2 is connected to the ground layer of the mounting substrate 210. The second ground terminal T23 is a terminal that is connected to the ground layer of the mounting substrate 210 and has ground potential. The first electronic component 10 includes a second input wiring portion 26, a second output wiring portion 27, and a second ground wiring portion 28. The second input wiring portion 26 is provided on the substrate 100 and connects the second input terminal T21 to the second transmission filter 2. The second output wiring portion 27 is provided on the substrate 100 and connects the second output terminal T22 and the second transmission filter 2. The second ground wiring portion 28 is provided on the substrate 100 and connects the second ground terminal T23 and the second transmission filter 2. In the first electronic component 10, the IDT electrode 24 connected to the second input terminal T21 without interposing other IDT electrodes 24 among the plurality of IDT electrodes 24 constitutes a second functional electrode E2 connected to the second input terminal T21. The second functional electrode E2 is the IDT electrode 24 corresponding to the series arm resonator closest to the first switch 8 (see FIG. 1) in terms of circuit among the plurality of second resonators.

The third input terminal T31 connected to the first reception filter 3 is connected to the selection terminal 91 of the second switch 9 (see FIG. 1) via the mounting substrate 210 (see FIG. 2). The third input terminal T31 is a terminal for inputting a radio-frequency signal to the first reception filter 3. The third output terminal T32 connected to the first reception filter 3 is connected to the input terminal of the first low noise amplifier 161 (see FIG. 1) via the mounting substrate 210. The third output terminal T32 is a terminal for outputting the radio-frequency signal that has passed through the first reception filter 3. In addition, the third ground terminal T33 connected to the first reception filter 3 is connected to the ground layer of the mounting substrate 210. The third ground terminal T33 is a terminal that is connected to the ground layer of the mounting substrate 210 and has ground potential. The first electronic component 10 includes a third input wiring portion 36, a third output wiring portion 37, and a third ground wiring portion 38. The third input wiring portion 36 is provided on the substrate 100 and connects the third input terminal T31 and the first reception filter 3. The third output wiring portion 37 is provided on the substrate 100 and connects the third output terminal T32 and the first reception filter 3. The third ground wiring portion 38 is provided on the substrate 100 and connects the third ground terminal T33 and the first reception filter 3.

In the first electronic component 10, in plan view from the thickness direction D0 of the mounting substrate 210, the first input terminal T11, the first ground terminal T13, the third ground terminal T33, the second ground terminal T23, the second input terminal T21, the fourth ground terminal T43, and the fourth output terminal T42 are arranged in the longitudinal direction of the substrate 100 in the order of the first input terminal T11, the first ground terminal T13, the third ground terminal T33, the second ground terminal T23, the second input terminal T21, the fourth ground terminal T43, and the fourth output terminal T42. In the first electronic component 10, the third ground terminal T33 and the third ground wiring portion 38 constitute the metallic member M1 arranged between the first input terminal T11 and the second input terminal T21 in a side view from the second direction D2 orthogonal to the first direction D1 in which the first input terminal T11 and the second input terminal T21 are arranged and the thickness direction D0 of the mounting substrate 210 (see FIG. 2). Here, the metallic member M1 is arranged between the first functional electrode E1 and the second functional electrode E2 in a side view from a second direction D2a orthogonal to a first direction D1a in which the first functional electrode E1 and the second functional electrode E2 are arranged and the thickness direction D0 of the mounting substrate 210 (see FIG. 2). The material of the third ground wiring portion 38 is, for example, Al, Cu, Pt, Au, Ag, Ti, Ni, Cr, Mo, W, Ta, Mg, Fe, an alloy or the like containing any of these metals as a main component. In addition, the material of the third ground terminal T33 is, for example, solder. The metallic member M1 is arranged between the first input terminal T11 and the second input terminal T21 in plan view from the thickness direction D0 of the mounting substrate 210. The case where the metallic member M1 "is arranged between the first input terminal T11 and the second input terminal T21 in plan view from the thickness direction D0 of the mounting substrate 210" includes not only the case where the metallic member M1 is located on a straight line connecting an arbitrary point of the first input terminal T11 and an arbitrary point of the second input terminal T21 as viewed in plan view from the thickness direction D0, but also the case where the metallic member M1 is located on a straight line connecting an arbitrary point of a first conductor portion configured by the first input terminal T11, the first input wiring portion 16, and the first functional electrode E1 and an arbitrary point of a second conductor portion configured by the second input terminal T21, the second input wiring portion 26, and the second functional electrode E2. In addition, the metallic member M1 is arranged between the first functional electrode E1 and the second functional electrode E2 in plan view from the thickness direction D0 of the mounting substrate 210. The case where the metallic member M1 "is arranged between the first functional electrode E1 and the second functional electrode E2 in plan view from the thickness direction D0 of the mounting substrate 210" includes not only the case where the metallic member M1 is located on a straight line connecting an arbitrary point of the first functional electrode E1 and an arbitrary point of the second functional electrode E2 as viewed in plan view from the thickness direction D0, but also the case where the metallic member M1 is located on a straight line connecting an arbitrary point of the first conductor portion configured by the first input terminal T11, the first input wiring portion 16, and the first functional electrode E1, and an arbitrary point of the second conductor portion configured by the second input terminal T21, the second input wiring portion 26, and the second functional electrode E2.

The fourth input terminal T41 connected to the second reception filter 4 is connected to the selection terminal 91 of the second switch 9 (see FIG. 1) via the mounting substrate 210 (see FIG. 2). The fourth input terminal T41 is a terminal for inputting a radio-frequency signal to the second reception filter 4. The fourth output terminal T42 connected to the second reception filter 4 is connected to the input terminal of the second low noise amplifier 162 (see FIG. 1) via the mounting substrate 210. The fourth output terminal T42 is a terminal for outputting the radio-frequency signal that has passed through the second reception filter 4. In addition, the fourth ground terminal T43 connected to the second reception filter 4 is connected to the ground layer of the mounting substrate 210. The fourth ground terminal T43 is a terminal that is connected to the ground layer of the mounting substrate 210 and has ground potential. The first electronic component 10 includes a fourth input wiring portion 46, a fourth output wiring portion 47, and a fourth ground wiring portion 48. The fourth input wiring portion 46 is provided on the substrate 100 and connects the fourth input terminal T41 and the second reception filter 4. The fourth output wiring portion 47 is provided on the substrate 100 and connects the fourth output terminal T42 and the second reception filter 4. The fourth ground wiring portion 48 is provided on the substrate 100 and connects the fourth ground terminal T43 and the second reception filter 4.

Figure 4:
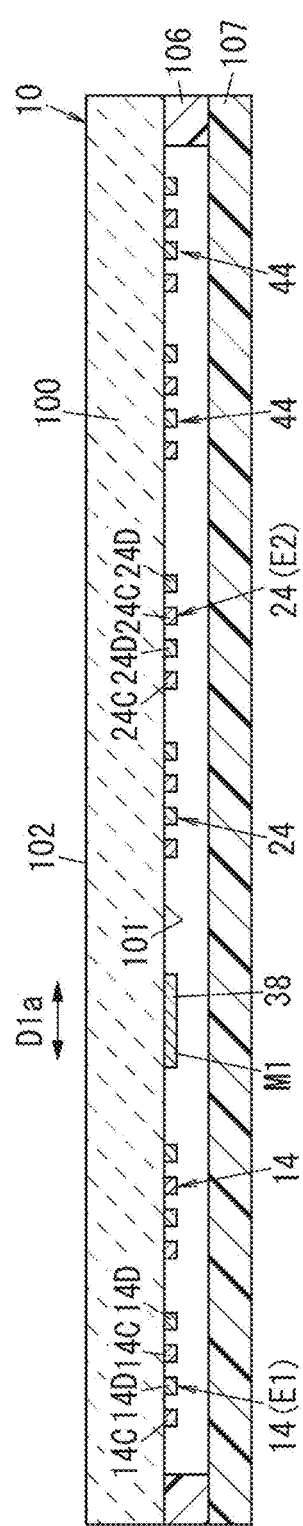
FIG. 4 is a cross-sectional view taken along line X1-X1 in FIG. 3, illustrating the electronic component in the above radio-frequency module.
Figure 5:
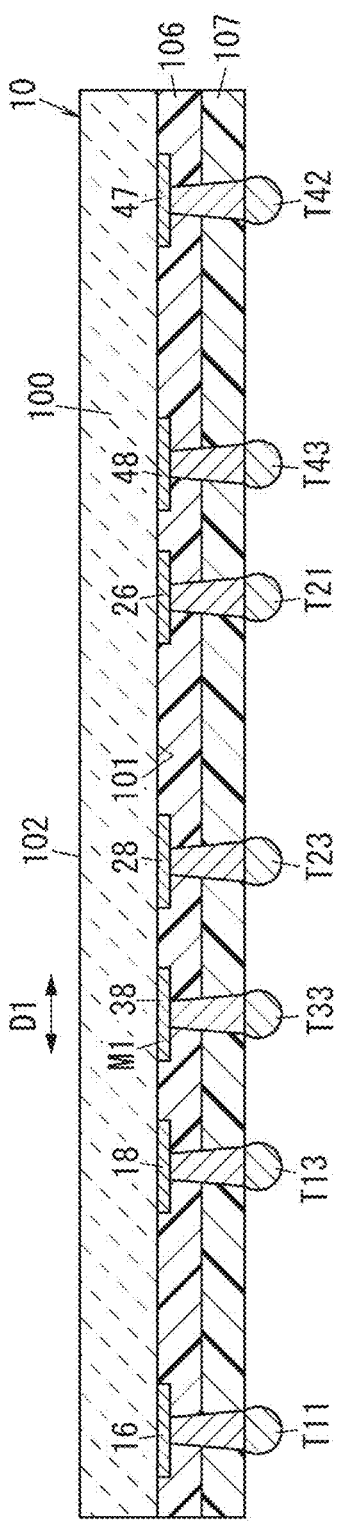
FIG. 5 is a cross-sectional view taken along line X2-X2 in FIG. 3, illustrating the electronic component in the above radio-frequency module.

As illustrated in FIG. 3 to FIG. 5, the substrate 100 in the first electronic component 10 has a first main surface 101 and a second main surface 102 facing each other in the thickness direction of the substrate 100. The plurality of IDT electrodes 14, the plurality of IDT electrodes 24, the plurality of IDT electrodes 34, and the plurality of IDT electrodes 44 described above are provided on the first main surface 101 of the substrate 100. In addition, the first input terminal T11, the first output terminal T12, the first ground terminal T13, the second input terminal T21, the second output terminal T22, the second ground terminal T23, the third input terminal T31, the third output terminal T32, the third ground terminal T33, the fourth input terminal T41, the fourth output terminal T42, and the fourth ground terminal T43 are provided on the first main surface 101 of the substrate 100. In addition, the first wiring portion 15, the first input wiring portion 16, the first output wiring portion 17, the first ground wiring portion 18, the second wiring portion 25, the second input wiring portion 26, the second output wiring portion 27, the second ground wiring portion 28, the third wiring portion 35, the third input wiring portion 36, the third output wiring portion 37, the third ground wiring portion 38, the fourth wiring portion 45, the fourth input wiring portion 46, the fourth output wiring portion 47, and the fourth ground wiring portion 48 are provided on the first main surface 101 of the substrate 100.

In addition, the first electronic component 10 includes, as a component of the package structure, a spacer layer 106 (see FIG. 4 and FIG. 5), a cover member 107 (see FIG. 4 and FIG. 5), and a plurality of external terminals. The plurality of external terminals include the first input terminal T11, the first output terminal T12, the first ground terminal T13, the second input terminal T21, the second output terminal T22, the second ground terminal T23, the third input terminal T31, the third output terminal T32, the third ground terminal T33, the fourth input terminal T41, the fourth output terminal T42, and the fourth ground terminal T43 described above. In FIG. 3, the spacer layer 106 and the cover member 107 are not illustrated.

The spacer layer 106 is provided on the first main surface 101 of the substrate 100. In plan view from the thickness direction of the substrate 100, the spacer layer 106 includes a rectangular frame-shaped portion formed along the outer edge of the substrate 100. The spacer layer 106 has electrical insulation properties. The material of the spacer layer 106 is epoxy resin, polyimide, or the like. The cover member 107 has a flat plate shape. The cover member 107 is arranged on the spacer layer 106 so as to face the substrate 100 in the thickness direction of the substrate 100. The cover member 107 overlaps the plurality of IDT electrodes 14, the plurality of IDT electrodes 24, the plurality of IDT electrodes 34, and the plurality of IDT electrodes 44 in the thickness direction of the substrate 100 and is separated from the plurality of IDT electrodes 14, the plurality of IDT electrodes 24, the plurality of IDT electrodes 34, and the plurality of IDT electrodes 44 in the thickness direction of the substrate 100. The cover member 107 has electrical insulation properties. The material of the cover member 107 is epoxy resin, polyimide, or the like. The plurality of external terminals are exposed from the cover member 107. The first electronic component 10 is connected to the first main surface 211 of the mounting substrate 210 by the plurality of external terminals. "Being connected to the first main surface 211 of the mounting substrate 210 by the plurality of external terminals" means that the plurality of external terminals of the first electronic component 10 are directly bonded to the first main surface 211 of the mounting substrate 210, and are mechanically and electrically connected to the plurality of conductor portions of the mounting substrate 210 overlapping the first electronic component 10 in the thickness direction D0 of the mounting substrate 210 (see FIG. 2).

(2.4) Layout of Radio-Frequency Module

In the radio-frequency module 200, as illustrated in FIG. 2, the first electronic component 10 is mounted on the first main surface 211 of the mounting substrate 210, and the second electronic component 20 is mounted on the second main surface 212 of the mounting substrate 210. In the radio-frequency module 200, the second electronic component 20 overlaps each of the first transmission filter 1 (see FIG. 3) and the second transmission filter 2 (see FIG. 3) of the first electronic component 10 in plan view from the thickness direction D0 of the mounting substrate 210. In the radio-frequency module 200, the second electronic component 20 overlaps a part of the first electronic component 10 in plan view from the thickness direction D0 of the mounting substrate 210, but may overlap all of the first electronic component 10. In addition, the second electronic component 20 may overlap a part of each of the first transmission filter 1 and the second transmission filter 2, overlap a part of one of the first transmission filter 1 and the second transmission filter 2 and all of the other of the first transmission filter 1 and the second transmission filter 2, or overlap all of each of the first transmission filter 1 and the second transmission filter 2 in plan view from the thickness direction D0 of the mounting substrate 210.

The second electronic component 20 includes a through conductor 204 and a bump 205. The through conductor 204 has a first end 241 on the mounting substrate 210 side and a second end 242 on the side opposite to the mounting substrate 210 side. The bump 205 is connected to the first end 241 of the through conductor 204. The bump 205 has conductivity. The first end 241 of the through conductor 204 is connected to a ground conductor portion 104 of the mounting substrate 210 via the bump 205. The ground conductor portion 104 overlaps the third ground terminal T33 in plan view from the thickness direction D0 of the mounting substrate 210. The ground conductor portion 104 is connected to the third ground terminal T33 and the ground layer of the mounting substrate 210. The second end 242 of the through conductor 204 is connected to the ground terminal 226.

(3) Effect

(3.1) Radio-Frequency Module

The radio-frequency module 200 according to the embodiment includes the mounting substrate 210 and the electronic component 10. The mounting substrate 210 has the first main surface 211 and the second main surface 212 facing each other. The electronic component 10 is mounted on the first main surface 211 of the mounting substrate 210. The electronic component 10 includes the first transmission filter 1, the second transmission filter 2, the first input terminal T11 and the first output terminal T12, and the second input terminal T21 and the second output terminal T22. The first transmission filter 1 has a pass band including the transmission band of the first communication band. The second transmission filter 2 has a pass band including the transmission band of the second communication band. The first input terminal T11 and the first output terminal T12 are connected to the input end and the output end of the signal path of the first transmission filter 1, respectively. The second input terminal T21 and the second output terminal T22 are connected to the input end and the output end of the signal path of the second transmission filter 2, respectively. The first transmission filter 1 includes the first substrate. The second transmission filter 2 includes the second substrate. The first substrate and the second substrate are common. The first communication band and the second communication band are communication bands available for simultaneous communication. The electronic component 10 further includes the metallic member M1 at ground potential. The metallic member M1 is arranged between the first input terminal T11 and the second input terminal T21 in a side view from the second direction D2 orthogonal to the first direction D1 in which the first input terminal T11 and the second input terminal T21 are arranged and the thickness direction D0 of the mounting substrate 210.

In the radio-frequency module 200 according to the embodiment, it is possible to improve heat dissipation. As a result, in the radio-frequency module 200, the temperature increase in each of the first transmission filter 1 and the second transmission filter 2 can be suppressed, and the deterioration of the characteristics of each of the first transmission filter 1 and the second transmission filter 2 can be suppressed.

In the radio-frequency module 200, the temperatures of the first transmission filter 1 and the second transmission filter 2 during operation are higher than the temperatures of the first reception filter 3 and the second reception filter 4 during operation, and the temperatures of the first transmission filter 1 and the second transmission filter 2 tend to increase. In addition, in the radio-frequency module 200, the IDT electrode 14 of the first resonator connected to the first input terminal T11 among the plurality of first resonators in the first transmission filter 1 tends to generate heat, and the first input terminal T11 of the first input terminal T11, the first output terminal T12, and the first ground terminal T13 tends to generate heat. In addition, in the radio-frequency module 200, the IDT electrode 24 of the second resonator connected to the second input terminal T21 among the plurality of second resonators in the second transmission filter 2 tends to generate heat, and the second input terminal T21 of the second input terminal T21, the second output terminal T22, and the second ground terminal T23 tends to generate heat. In addition, in the radio-frequency module 200, the first communication band corresponding to the pass band of the first transmission filter 1 and the second communication band corresponding to the pass band of the second transmission filter 2 are communication bands available for simultaneous communication. Here, in the radio-frequency module 200, simultaneous transmission using the first transmission filter 1 and the second transmission filter 2 is possible, and the temperature is likely to increase compared to a case where the first transmission filter 1 and the second transmission filter 2 are different electronic components. However, in the radio-frequency module 200, the metallic member M1 at ground potential is arranged between the first input terminal T11 and the second input terminal T21 in a side view from the second direction D2. Therefore, under a condition the radio-frequency module 200 performs simultaneous communication using the first transmission filter 1 and the second transmission filter 2, heat generated in the first transmission filter 1 and the second transmission filter 2 can be dissipated to the mounting substrate 210 via the metallic member M1 including the third ground terminal T33 connected to the first reception filter 3.

In addition, in the radio-frequency module 200, the metallic member M1 at ground potential is arranged between the first input terminal T11 and the second input terminal T21 in a side view from the second direction D2, thereby improving the isolation between the first transmission filter 1 and the second transmission filter 2. In addition, in the radio-frequency module 200, since the first transmission filter 1 and the second transmission filter 2 are included in one first electronic component 10, it is possible to reduce the external size of the radio-frequency module 200 in plan view from the thickness direction D0 of the mounting substrate 210.

In addition, in the radio-frequency module 200, the metallic member M1 at ground potential is arranged between the first functional electrode E1 and the second functional electrode E2 in a side view from the second direction D2*a* orthogonal to the first direction D1*a* in which the first functional electrode E1 and the second functional electrode E2 are arranged and the thickness direction D0 of the mounting substrate 210. Therefore, the radio-frequency module 200 can improve heat dissipation. In addition, in the radio-frequency module 200, the metallic member M1 at ground potential is arranged between the first functional electrode E1 and the second functional electrode E2 in a side view from the second direction D2*a*, thereby improving the isolation between the first transmission filter 1 and the second transmission filter 2.

In addition, in the radio-frequency module 200, the first ground terminal T13 is located between the first input terminal T11 and the metallic member M1, and the second ground terminal T23 is located between the second input terminal T21 and the metallic member M1, in a side view from the second direction D2. Therefore, in the radio-frequency module 200, the isolation between the first transmission filter 1 and the second transmission filter 2 can be improved.

In the radio-frequency module 200, the shield layer 180 is in contact with the main surface 10B of the first electronic component 10 on the side opposite to the mounting substrate 210 side. Thus, in the radio-frequency module 200, heat generated in the first electronic component 10 can be easily dissipated through the shield layer 180, and thus heat dissipation can be further improved.

(3.2) Communication Device

The communication device 300 according to the embodiment includes the signal processing circuit 301 and the radio-frequency module 200. The signal processing circuit 301 is connected to the radio-frequency module 200.

Since the communication device 300 includes the radio-frequency module 200, it is possible to improve heat dissipation.

The plurality of electronic components constituting the signal processing circuit 301 may be mounted on, for example, the above-described circuit board, or may be mounted on a circuit board (second circuit board) different from the circuit board (first circuit board) on which the radio-frequency module 200 is mounted.

(4) Modification 1 of Radio-Frequency Module

The radio-frequency module 200 according to Modification 1 does not include the third transmission filter 5 and the fourth transmission filter 6, for example. In Modification 1, for example, the pass band of the first transmission filter 1, the pass band of the second transmission filter 2, the pass band of the first reception filter 3, and the pass band of the second reception filter 4 may correspond to the transmission band of Band 25 of the 3GPP LTE standard, the transmission band of Band 66 of the 3GPP LTE standard, the reception band of Band 25 of the 3GPP LTE standard, and the reception band of Band 66 of the 3GPP LTE standard, respectively. The transmission band of Band 25 is 1930 MHz to 1995 MHz. The transmission band of Band 66 is 1710 MHz to 1780 MHz. The reception band of Band 25 is 1930 MHz to 1995 MHz. The reception band of Band 66 is 2110 MHz to 2200 MHz. In addition, in Modification 1, the first power amplifier 151, the second power amplifier 152, the first low noise amplifier 161, and the second low noise amplifier 162 amplify radio-frequency signals corresponding to the transmission band of Band 25, the transmission band of Band 66, the reception band of Band 25, and the reception band of Band 66 of the 3GPP LTE standard, respectively.

In addition, in Modification 1 of the radio-frequency module 200, for example, the pass band of the first transmission filter 1, the second transmission filter 2, the first reception filter 3, and the second reception filter 4 may correspond to the transmission band of Band 7, the transmission band of Band 3, the reception band of Band 7, and the reception band of Band 3 of the 3GPP LTE standard, respectively. The transmission band of Band 7 is 2500 MHz to 2570 MHz. The transmission band of Band 3 is 1710 MHz to 1785 MHz. The reception band of Band 7 is 2620 MHz to 2690 MHz. In addition, in Modification 1, the first power amplifier 151, the second power amplifier 152, the first low noise amplifier 161, and the second low noise amplifier 162 amplify radio-frequency signals corresponding to the transmission band of Band 7, the transmission band of Band 3, the reception band of Band 7, and the reception band of Band 3 of the 3GPP LTE standard, respectively.

(5) Other Examples of First Electronic Component in Radio-Frequency Module

(5.1) Example 1 of First Electronic Component

In Example 1 of the electronic component 10 (first electronic component 10), the substrate 100 is, for example, a piezoelectric substrate including a silicon substrate, a low acoustic velocity film formed on the silicon substrate, and a piezoelectric layer formed on the low acoustic velocity film. The material of the piezoelectric layer is, for example, lithium niobate or lithium tantalate. The low acoustic velocity film is a film in which the acoustic velocity of a bulk wave propagating through the low acoustic velocity film is lower than the acoustic velocity of a bulk wave propagating through the piezoelectric layer. The material of the low acoustic velocity film is, for example, silicon oxide, but is not limited to silicon oxide, and may be made of at least one kind of material selected from the group consisting of tantalum oxide and compounds obtained by adding fluorine, carbon or boron to silicon oxide. In the silicon substrate, the acoustic velocity of a bulk wave propagating through the silicon substrate is higher than the acoustic velocity of an acoustic wave propagating through the piezoelectric layer. Here, the bulk wave propagating through the silicon substrate is a bulk wave having the lowest acoustic velocity among a plurality of bulk waves propagating through the silicon substrate.

The piezoelectric substrate may further include a high acoustic velocity film provided between the silicon substrate and the low acoustic velocity film. The high acoustic velocity film is a film in which the acoustic velocity of a bulk wave propagating through the high acoustic velocity film is higher than the acoustic velocity of an acoustic wave propagating through the piezoelectric layer. The material of the high acoustic velocity film is, for example, silicon nitride, but is not limited to silicon nitride, and may be at least one kind of material selected from the group consisting of diamond-like carbon, aluminum nitride, silicon carbide, silicon nitride, silicon oxynitride, silicon, sapphire, lithium tantalate, lithium niobate, crystal, zirconia, cordierite, mullite, steatite, forsterite, magnesia, and diamond.

The thickness of the piezoelectric layer is, for example, equal to or less than 3.5λ, where λ is the wavelength of an acoustic wave determined by the electrode finger period of each of the IDT electrode 14, the IDT electrode 24, the IDT electrode 34, and the IDT electrode 44. The thickness of the low acoustic velocity film is, for example, equal to or less than 2.0λ.

The piezoelectric substrate may include, for example, a close contact layer interposed between the low acoustic velocity film and the piezoelectric layer. The close contact layer is made of, for example, resin (epoxy resin, polyimide resin). In addition, the piezoelectric substrate may include a dielectric film at any of portions between the low acoustic velocity film and the piezoelectric layer, on the piezoelectric layer, and under the low acoustic velocity film.

(5.2) Example 2 of First Electronic Component

Example 2 of the electronic component 10 (first electronic component 10) is a bare chip (also referred to as a die) that does not include the spacer layer 106 and the cover member 107.

(5.3) Example 3 of First Electronic Component

Figure 6:
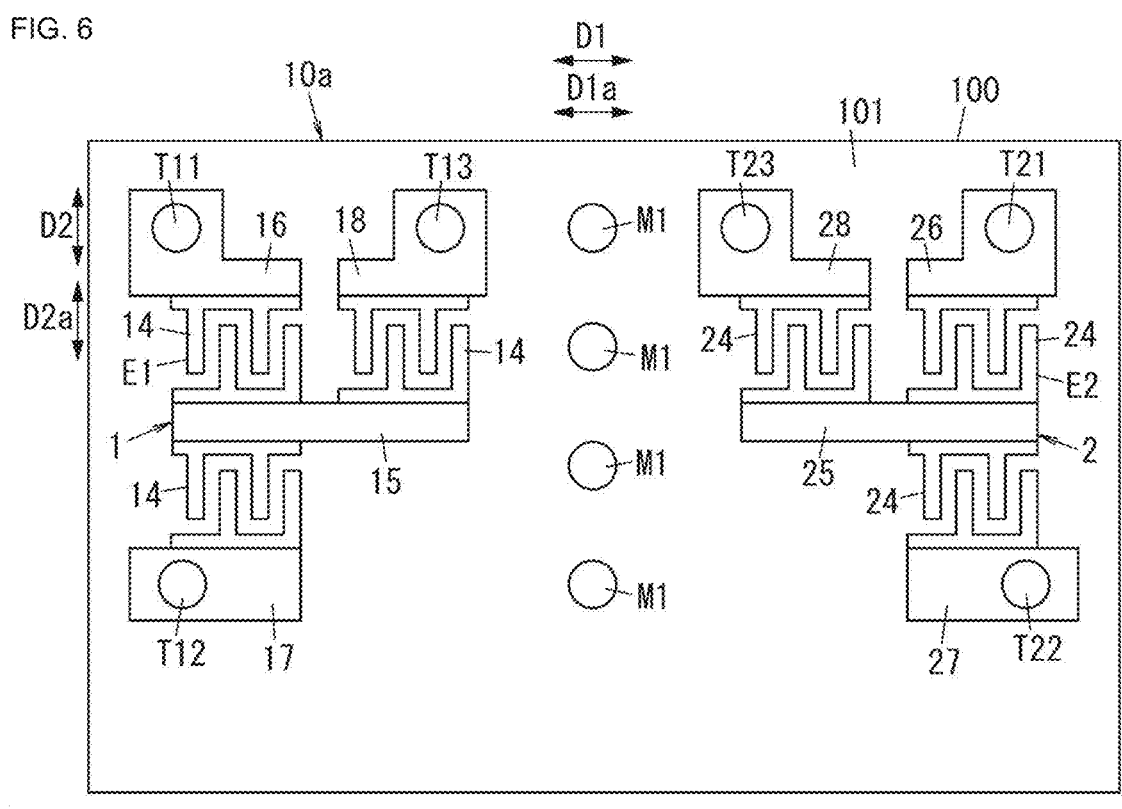
FIG. 6 is a plan view of another Example 3 of an electronic component in the above radio-frequency module.

An electronic component 10a (first electronic component 10a) according to Example 3 will be described with reference to FIG. 6. In the first electronic component 10a according to Example 3, the same components as those of the first electronic component 10 of the radio-frequency module 200 according to the embodiment are denoted by the same symbols, and description thereof will be omitted as appropriate.

The first electronic component 10a according to Example 3 does not include the first reception filter 3 and the second reception filter 4 of the first electronic component 10. The first electronic component 10a according to Example 3 includes a plurality of (for example, four) metallic members M1 at ground potential instead of the first reception filter 3 and the metallic member M1 at ground potential of the electronic component 10 of the radio-frequency module 200 according to the embodiment. Each of the plurality of metallic members M1 is, for example, a solder bump. In the electronic component 10a, the plurality of metallic members M1 are arranged in the second direction D2 and the second direction D2a in plan view from the thickness direction D0 of the mounting substrate 210 (see FIG. 2). In the electronic component 10a, in plan view from the thickness direction D0 of the mounting substrate 210, the four metallic members M1 include the metallic member M1 arranged on a straight line connecting the first input terminal T11 and the second input terminal T21, the metallic member M1 arranged on a straight line connecting the first functional electrode E1 and the second functional electrode E2, the metallic member M1 arranged on a straight line connecting the IDT electrode 14 connected to the first output terminal T12 and the IDT electrode 24 connected to the second output terminal T22, and the metallic member M1 arranged on a straight line connecting the first output terminal T12 and the second output terminal T22.

(5.4) Example 4 of First Electronic Component

Figure 7:
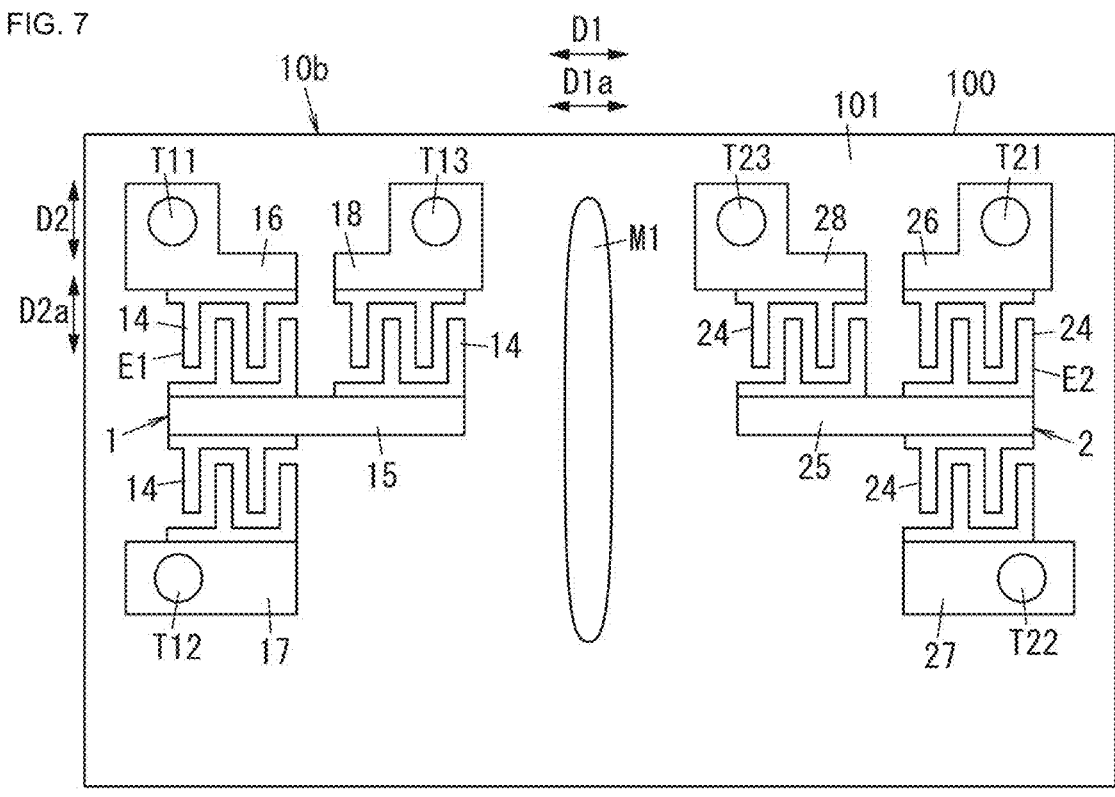
FIG. 7 is a plan view of another Example 4 of an electronic component in the above radio-frequency module.

An electronic component 10b (first electronic component 10b) according to Example 4 will be described with reference to FIG. 7. In the first electronic component 10b according to Example 4, the same components as those of the first electronic component 10a according to Example 3 are denoted by the same symbols, and description thereof will be omitted as appropriate.

The metallic member M1 at ground potential is an elongated bump. The elongated shape is a shape elongated in one direction along the second direction D2 and the second direction D2a, and the elongated direction indicates the one direction. More specifically, the elongated shape is a shape in which a length in one direction is longer than a length in another direction intersecting with the one direction. The bump has conductivity. The bump is, for example, a solder bump. In the metallic member M1, the length in the elongated direction along the second direction D2 and the second direction D2a is larger than the length in a direction along the first direction D1 and the first direction D1a (the other direction intersecting with the elongated direction). In the electronic component 10*b*, in plan view from the thickness direction D0 of the mounting substrate 210 (see FIG. 2), the metallic member M1 is located on a straight line connecting the first input terminal T11 and the second input terminal T21, located on a straight line connecting the first functional electrode E1 and the second functional electrode E2, located on a straight line connecting the IDT electrode 14 connected to the first output terminal T12 and the IDT electrode 24 connected to the second output terminal T22, and located on a straight line connecting the first output terminal T12 and the second output terminal T22. Therefore, in the radio-frequency module 200 including the electronic component 10*b* according to Example 4 instead of the first electronic component 10, it is possible to further improve heat dissipation.

(5.5) Example 5 of First Electronic Component

Figure 8:
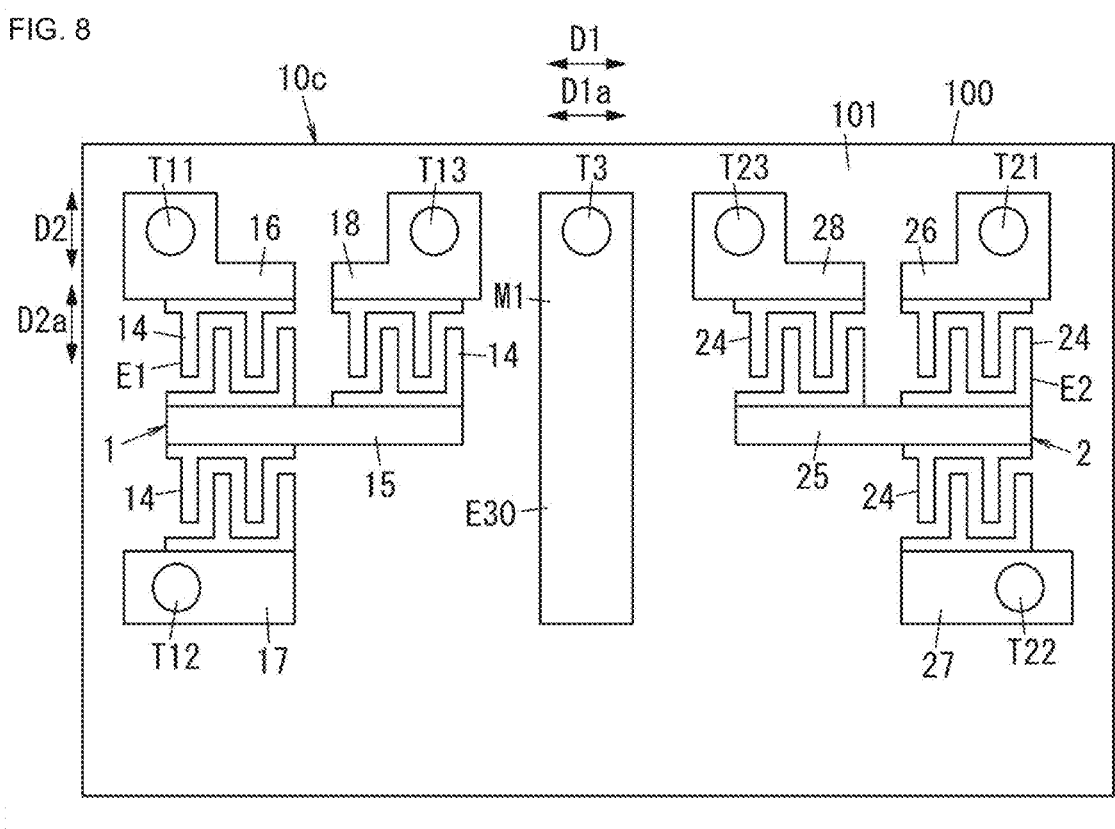
FIG. 8 is a plan view of another Example 5 of an electronic component in the above radio-frequency module.

An electronic component 10*c* (first electronic component 10*c*) according to Example 5 will be described with reference to FIG. 8. In the first electronic component 10*c* according to Example 5, the same components as those of the first electronic component 10*a* according to Example 3 are denoted by the same symbols, and description thereof will be omitted as appropriate.

The metallic member M1 at ground potential includes a ground electrode E30 having the longitudinal direction along the second direction D2 and the second direction D2*a*, and a ground terminal T3 provided on the ground electrode E30. The ground terminal T3 is a bump. The bump has conductivity. The bump is, for example, a solder bump. In the ground electrode E30, the width in the longitudinal direction along the second direction D2 and the second direction D2*a* is larger than the width in the lateral direction along the first direction D1 and the first direction D1*a*. In the electronic component 10*c*, in plan view from the thickness direction D0 of the mounting substrate 210 (see FIG. 2), the ground electrode E30 is located on a straight line connecting the first input terminal T11 and the second input terminal T21, located on a straight line connecting the first functional electrode E1 and the second functional electrode E2, located on a straight line connecting the IDT electrode 14 connected to the first output terminal T12 and the IDT electrode 24 connected to the second output terminal T22, and located on a straight line connecting the first output terminal T12 and the second output terminal T22. In the electronic component 10*c*, the ground terminal T3 is located on a straight line connecting the first input terminal T11 and the second input terminal T21 in plan view from the thickness direction D0 of the mounting substrate 210. In the radio-frequency module 200 according to Example 5 including the electronic component 10*c* instead of the first electronic component 10, it is possible to further improve heat dissipation.

(5.6) Example 6 of First Electronic Component

Figure 9:
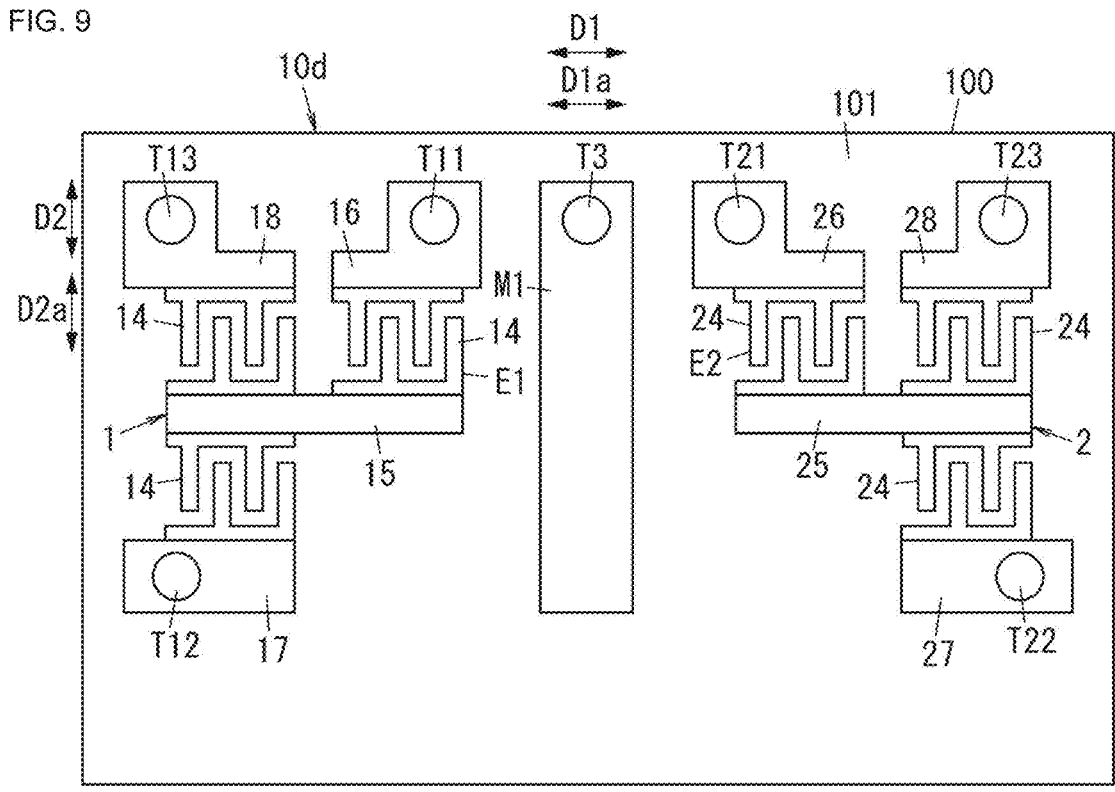
FIG. 9 is a plan view of another Example 6 of an electronic component in the above radio-frequency module.

An electronic component 10*d* (first electronic component 10*d*) according to Example 6 will be described with reference to FIG. 9. In the first electronic component 10*d* according to Example 6, the same components as those of the first electronic component 10*c* according to Example 5 are denoted by the same symbols, and description thereof will be omitted as appropriate.

The electronic component 10*d* according to Example 6 is different from the electronic component 10*c* according to Example 5 in that the first input terminal T11 is located between the first ground terminal T13 and the metallic member M1 and the second input terminal T21 is located between the second ground terminal T23 and the metallic member M1 in a side view from the second direction D2.

In the radio-frequency module 200 according to Example 6 including the electronic component 10*d* instead of the first electronic component 10, it is possible to further improve heat dissipation and further improve isolation.

(5.7) Example 7 of First Electronic Component

Figure 10:
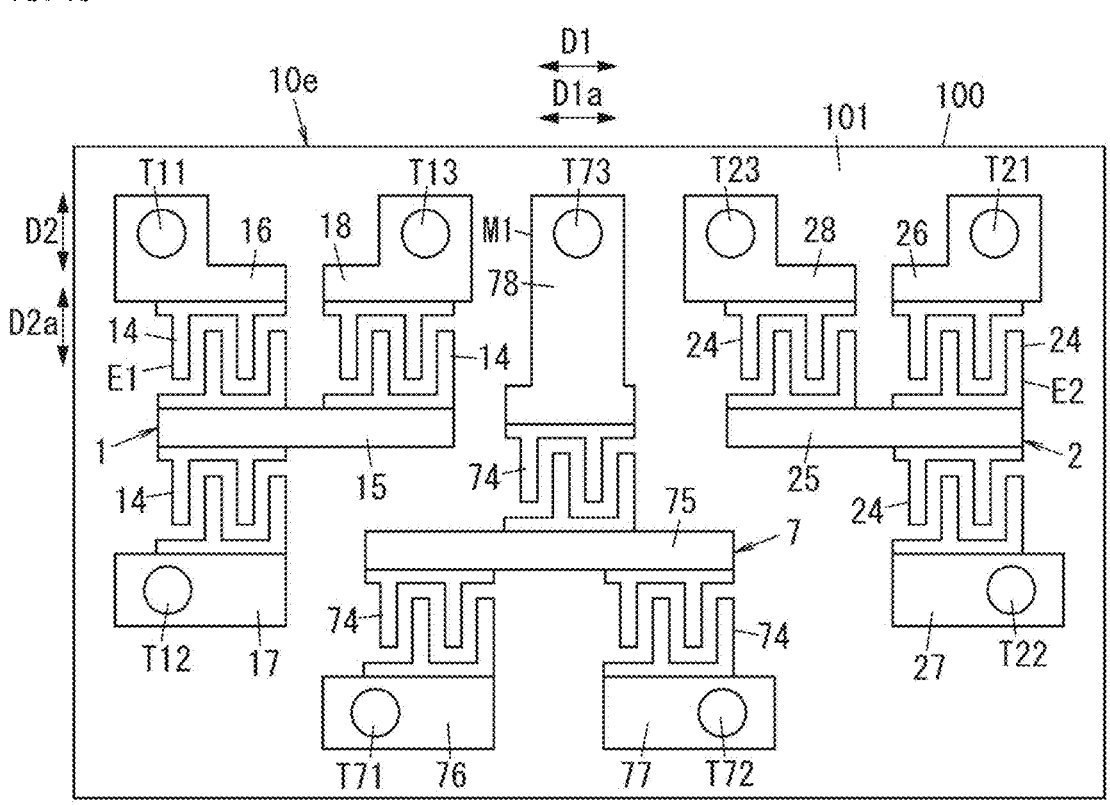
FIG. 10 is a plan view of another Example 7 of an electronic component in the above radio-frequency module.

An electronic component 10*e* (first electronic component 10*e*) according to Example 7 will be described with reference to FIG. 10. In the first electronic component 10*e* according to Example 7, the same components as those of the first electronic component 10 of the radio-frequency module 200 according to the embodiment are denoted by the same symbols, and description thereof will be omitted as appropriate.

The first electronic component 10*e* according to Example 7 is different from the first electronic component 10 in that the first electronic component 10*e* does not include the second reception filter 4 and further includes a third transmission filter 7 instead of the first reception filter 3. The third transmission filter 7 has a pass band including the transmission band of the third communication band. In the first electronic component 10*e* according to Example 7, the third communication band has a pass band including a transmission band different from the first communication band and the second communication band. The third transmission filter 7 includes the third substrate (substrate 100). The first substrate, the second substrate, and the third substrate are common. The third communication band is a communication band that is not used for simultaneous communication with either of the first communication band and the second communication band. The metallic member M1 at ground potential includes a ground terminal (third ground terminal T73) connected to the third transmission filter 7.

The first communication band is Band 1 of the 3GPP LTE standard or n1 of the 5G NR standard. The second communication band is Band 3 of the 3GPP LTE standard or n3 of the 5G NR standard. The third communication band is any one of Band 25 of the 3GPP LTE standard, n25 of the 5G NR standard, Band 66 of the 3GPP LTE standard, n66 of the 5G NR standard, Band 34 of the 3GPP LTE standard, n34 of the 5G NR standard, Band 39 of the 3GPP LTE standard, and n39 of the 5G NR standard. In addition, the third communication band may be Band 30 of the 3GPP LTE standard or n30 of the 5G NR standard.

In addition, the combination of the first communication band, the second communication band, and the third communication band is not limited to the above-described example, and may be the following example.

Under a condition the first communication band is Band 1 of the 3GPP LTE standard or n1 of the 5G NR standard, and the second communication band is Band 40 of the 3GPP LTE standard or n40 of the 5G NR standard, the third communication band is any one of Band 25 of the 3GPP LTE standard, n25 of the 5G NR standard, Band 66 of the 3GPP LTE standard, n66 of the 5G NR standard, Band 30 of the 3GPP LTE standard, n30 of the 5G NR standard, Band 34 of the 3GPP LTE standard, n34 of the 5G NR standard, Band 39 of the 3GPP LTE standard, and n39 of the 5G NR standard.

Under a condition the first communication band is Band 3 of the 3GPP LTE standard or n3 of the 5G NR standard, and the second communication band is Band 40 of the 3GPP LTE standard or n40 of the 5G NR standard, the third communication band is any one of Band 25 of the 3GPP LTE standard, n25 of the 5G NR standard, Band 66 of the 3GPP LTE standard, n66 of the 5G NR standard, Band 30 of the 3GPP LTE standard, n30 of the 5G NR standard, Band 34 of the 3GPP LTE standard, n34 of the 5G NR standard, Band 39 of the 3GPP LTE standard, and n39 of the 5G NR standard.

Under a condition the first communication band is Band 25 of the 3GPP LTE standard or n25 of the 5G NR standard, and the second communication band is Band 66 of the 3GPP LTE standard or n66 of the 5G NR standard, the third communication band is any one of Band 1 of the 3GPP LTE standard, n1 of the 5G NR standard, Band 3 of the 3GPP LTE standard, n3 of the 5G NR standard, Band 34 of the 3GPP LTE standard, n34 of the 5G NR standard, Band 39 of the 3GPP LTE standard, and n39 of the 5G NR standard.

Under a condition the first communication band is Band 25 of the 3GPP LTE standard or n25 of the 5G NR standard, and the second communication band is Band 30 of the 3GPP LTE standard or n30 of the 5G NR standard, the third communication band is any one of Band 1 of the 3GPP LTE standard, n1 of the 5G NR standard, Band 3 of the 3GPP LTE standard, n3 of the 5G NR standard, Band 34 of the 3GPP LTE standard, n34 of the 5G NR standard, Band 39 of the 3GPP LTE standard, and n39 of the 5G NR standard.

Under a condition the first communication band is Band 30 of the 3GPP LTE standard or n30 of the 5G NR standard, and the second communication band is Band 66 of the 3GPP LTE standard or n66 of the 5G NR standard, the third communication band is any one of Band 1 of the 3GPP LTE standard, n1 of the 5G NR standard, Band 3 of the 3GPP LTE standard, n3 of the 5G NR standard, Band 34 of the 3GPP LTE standard, n34 of the 5G NR standard, Band 39 of the 3GPP LTE standard, and n39 of the 5G NR standard.

Under a condition the first communication band is Band 34 of the 3GPP LTE standard or n34 of the 5G NR standard, and the second communication band is Band 39 of the 3GPP LTE standard or n39 of the 5G NR standard, the third communication band is any one of Band 1 of the 3GPP LTE standard, n1 of the 5G NR standard, Band 3 of the 3GPP LTE standard, n3 of the 5G NR standard, Band 25 of the 3GPP LTE standard, and n25 of the 5G NR standard.

The third transmission filter 7 includes the third substrate (substrate 100). In the first electronic component 10e, the first substrate, the second substrate, and the third substrate are common. In other words, in the first electronic component 10e, the first substrate, the second substrate, and the third substrate are the same substrate 100.

The third transmission filter 7 is a T-type filter including a plurality of (three) third resonators. More specifically, the third transmission filter 7 is a T-type filter including a plurality of third resonators and a third wiring portion 75 connecting the plurality of third resonators. The plurality of third resonators includes two series arm resonators and one parallel arm resonator. The third transmission filter 7 is, for example, an acoustic wave filter. In the acoustic wave filter, each of the plurality of third resonators is formed of an acoustic wave resonator. The acoustic wave filter is, for example, a surface acoustic wave filter using a surface acoustic wave. In the surface acoustic wave filter, each of the plurality of third resonators is, for example, a SAW resonator. The third transmission filter 7 is not limited to a T-type filter and may be, for example, a ladder filter.

The third substrate (substrate 100) is a piezoelectric substrate and is, for example, a lithium tantalate substrate or a lithium niobate substrate. The third transmission filter 7 includes a plurality of IDT electrodes 74 provided on the third substrate (substrate 100). The material of the plurality of IDT electrodes 74 is the same as the material of the plurality of IDT electrodes 14. In the third transmission filter 7, each of the plurality of IDT electrodes 74 is a component of a SAW resonator. The third wiring portion 75 is provided on the third substrate (substrate 100). The third wiring portion 75 connects the plurality of third resonators by connecting the plurality of IDT electrodes 74.

Instead of the third input terminal T31, the third output terminal T32, the third ground terminal T33, the third input wiring portion 36, the third output wiring portion 37, and the third ground wiring portion 38 in the first electronic component 10 (see FIG. 3), the first electronic component 10e includes a third input terminal T71, a third output terminal T72, a third ground terminal T73, a third input wiring portion 76, a third output wiring portion 77, and a third ground wiring portion 78. The third ground terminal T73 is connected to the ground layer of the mounting substrate 210 (see FIG. 2). The third ground terminal T73 is a terminal that is connected to the ground layer of the mounting substrate 210 and has ground potential. The third input wiring portion 76 is provided on the substrate 100 and connects the third input terminal T71 and the third transmission filter 7. The third output wiring portion 77 is provided on the substrate 100 and connects the third output terminal T72 and the third transmission filter 7. The third ground wiring portion 78 is provided on the substrate 100 and connects the third ground terminal T73 and the third transmission filter 7. In plan view from the thickness direction D0 of the mounting substrate 210, the first input terminal T11, the first ground terminal T13, the third ground terminal T73, the second ground terminal T23, and the second input terminal T21 are arranged in the order of the first input terminal T11, the first ground terminal T13, the third ground terminal T73, the second ground terminal T23, and the second input terminal T21 in the longitudinal direction of the substrate 100. In the first electronic component 10e, the third ground terminal T73 and the third ground wiring portion 78 constitute the metallic member M1 arranged between the first input terminal T11 and the second input terminal T21 in a side view from the second direction D2. Here, the metallic member M1 is arranged between the first functional electrode E1 and the second functional electrode E2 in a side view from the second direction D2a.

In the radio-frequency module 200 according to the embodiment including the electronic component 10e according to Example 7 instead of the first electronic component 10, for example, under a condition simultaneous communication is performed using the first transmission filter 1 and the second transmission filter 2, heat generated in the first transmission filter 1 and the second transmission filter 2 can be dissipated through the metallic member M1 including the third ground terminal T73 connected to the third transmission filter 7.

(6) Modification 2 of Radio-Frequency Module

Figure 11:
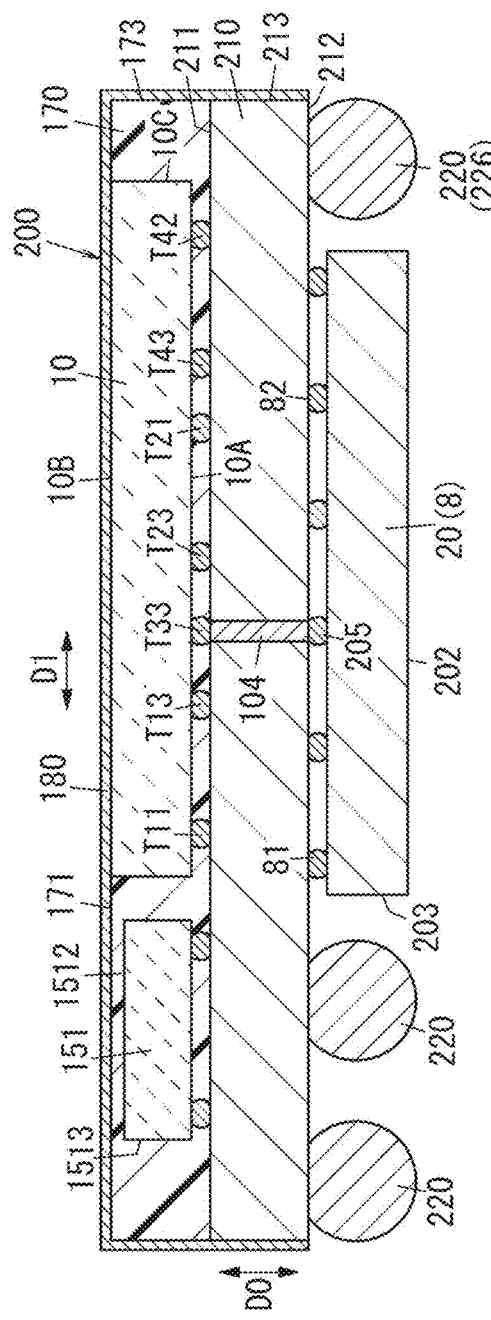
FIG. 11 is a cross-sectional view of Modification 2 of the above radio-frequency module.

As illustrated in FIG. 11, Modification 2 of the radio-frequency module 200 is different from the radio-frequency module 200 according to the embodiment in that the plurality of external connection terminals 220 is a ball bump. In addition, Modification 2 of the radio-frequency module 200 is different from the radio-frequency module 200 according to the embodiment in that the second resin layer 190 of the radio-frequency module 200 according to the embodiment is not provided. Modification 2 of the radio-frequency module 200 may include an underfill portion provided in a gap between the second electronic component 20 mounted on the second main surface 212 of the mounting substrate 210 and the second main surface 212 of the mounting substrate 210.

The material of the ball bump constituting each of the plurality of external connection terminals 220 is, for example, gold, copper, solder, or the like.

Modification

The above-described embodiment and the like are merely one of various embodiments of the present disclosure. The above-described embodiment and the like can be modified in various ways according to design and the like as long as an aspect of the present disclosure can be achieved.

Each of the first transmission filter 1, the second transmission filter 2, the first reception filter 3, the second reception filter 4, and the third transmission filter 7 is not limited to a surface acoustic wave filter and may be a bulk acoustic wave filter. In the bulk acoustic wave filter, each of the plurality of acoustic wave resonators is a bulk acoustic wave (BAW) resonator. In this case, in the electronic component 10, the substrate 100 is a silicon substrate or a spinel substrate, and the BAW resonator includes a first electrode provided on the first main surface 101 side of the substrate 100, a piezoelectric film on the first electrode, and a second electrode on the piezoelectric film. The material of the piezoelectric film is, for example, AlN, ScAlN, or PZT. The first functional electrode E1 is the first electrode or the second electrode of the BAW resonator connected to the first input terminal T11. The second functional electrode E2 is the first electrode or the second electrode of the BAW resonator connected to the second input terminal T21. The BAW resonator is a film bulk acoustic resonator (FBAR) or a solidly mounted resonator (SMR). In addition, one of the first transmission filter 1 and the second transmission filter 2 may be a surface acoustic wave filter, and the other may be a BAW filter.

In addition, each of the first transmission filter 1 and the second transmission filter 2 is not limited to a T-type filter or a ladder filter and may be, for example, a longitudinally coupled resonator-type surface acoustic wave filter or a combination thereof.

In addition, each of the first transmission filter 1 and the second transmission filter 2 may be, for example, an acoustic wave filter using boundary acoustic waves, plate waves, or the like.

In addition, the radio-frequency module 200 may have a configuration in which the second electronic component 20 is mounted on the first main surface 211 of the mounting substrate 210 instead of the second main surface 212.

The circuit configuration of the radio-frequency module 200 is not limited to the example of FIG. 1 described above. The radio-frequency module 200 may include, for example, a radio-frequency front-end circuit compatible with multi input multi output (MIMO) or evolved-universal terrestrial radio access new radio dual connectivity (ENDC) as a circuit configuration. Under a condition the radio-frequency module 200 has a circuit configuration compatible with MIMO or ENDC, the first communication band and the second communication band are not limited to being different from each other, and the first communication band and the second communication band may be the same. In addition, the first communication band, the second communication band, and the third communication band may be the same communication band.

Aspect

The following aspects are disclosed in this specification.

A radio-frequency module (200) according to a first aspect includes a mounting substrate (210) and an electronic component (10; 10a; 10b; 10c; 10d; 10e). The mounting substrate (210) has a first main surface (211) and a second main surface (212) facing each other. The electronic component (10; 10a; 10b; 10c; 10d; 10e) is mounted on the first main surface (211) of the mounting substrate (210). The electronic component (10; 10a; 10b; 10c; 10d; 10e) includes a first transmission filter (1), a second transmission filter (2), a first input terminal (T11) and a first output terminal (T12), and a second input terminal (T21) and a second output terminal (T22). The first transmission filter (1) has a pass band including a transmission band of a first communication band. The second transmission filter (2) has a pass band including a transmission band of a second communication band. The first input terminal (T11) and the first output terminal (T12) are connected to an input end and an output end, respectively, of a signal path of the first transmission filter (1). The second input terminal (T21) and the second output terminal (T22) are connected to an input end and an output end, respectively, of a signal path of the second transmission filter (2). The first transmission filter (1) includes a first substrate. The second transmission filter (2) includes a second substrate. The first substrate and the second substrate are common. The first communication band and the second communication band are communication bands available for simultaneous communication. The electronic component (10; 10a; 10b; 10c; 10d; 10e) further includes a metallic member (M1) at ground potential. In the electronic component (10; 10a; 10b; 10c; 10d; 10e), the metallic member (M1) is arranged at least at one of between the first input terminal (T11) and the second input terminal (T21) and between the first output terminal (T12) and the second output terminal (T22) in a side view.

In the radio-frequency module (200) according to the first aspect, it is possible to improve heat dissipation.

The radio-frequency module (200) according to a second aspect includes the mounting substrate (210) and the electronic component (10; 10a; 10b; 10c; 10d; 10e). The mounting substrate (210) has the first main surface (211) and the second main surface (212) facing each other. The electronic component (10; 10a; 10b; 10c; 10d; 10e) is mounted on the first main surface (211) of the mounting substrate (210). The electronic component (10; 10a; 10b; 10c; 10d; 10e) includes the first transmission filter (1), the second transmission filter (2), the first input terminal (T11) and the first output terminal (T12), and the second input terminal (T21) and the second output terminal (T22). The first transmission filter (1) has a pass band including a transmission band of the first communication band. The second transmission filter (2) has a pass band including a transmission band of the second communication band. The first input terminal (T11) and the first output terminal (T12) are connected to an input end and an output end, respectively, of a signal path of the first transmission filter (1). The second input terminal (T21) and the second output terminal (T22) are connected to an input end and an output end, respectively, of a signal path of the second transmission filter (2). The first transmission filter (1) includes a first substrate and a first functional electrode (E1). The first functional electrode (E1) is provided on the first substrate and connected to the first input terminal (T11). The second transmission filter (2) includes a second substrate and a second functional electrode (E2). The second functional electrode (E2) is provided on the second substrate and connected to the second input terminal (T21). The first substrate and the second substrate are common. The first communication band and the second communication band are communication bands available for simultaneous communication. The electronic component (10) further includes the metallic member (M1) at ground potential. In the electronic component (10; 10a; 10b; 10c; 10d; 10e), the metallic member (M1) is arranged between the first functional electrode (E1) and the second functional electrode (E2) in a side view.

In the radio-frequency module (200) according to the second aspect, it is possible to improve heat dissipation.

In the radio-frequency module (200) according to a third aspect, in the first or second aspect, the metallic member (M1) is an elongated bump.

In the radio-frequency module (200) according to the third aspect, it is possible to further improve heat dissipation.

In the radio-frequency module (200) according to a fourth aspect, in the first or second aspect, the electronic component (10) further includes a reception filter (a first reception filter 3). The reception filter (first reception filter 3) includes a third substrate. The first substrate, the second substrate, and the third substrate are common. The metallic member (M1) includes a ground terminal (third ground terminal T33) connected to the reception filter (first reception filter 3).

In the radio-frequency module (200) according to the fourth aspect, for example, Under a condition simultaneous communication is performed using the first transmission filter (1) and the second transmission filter (2), heat generated in the first transmission filter (1) and the second transmission filter (2) can be dissipated through the metallic member (M1) including the ground terminal (third ground terminal T33) of the reception filter (first reception filter 3).

In the radio-frequency module (200) according to a fifth aspect, in the first or second aspect, the electronic component (10e) further includes a third transmission filter (7). The third transmission filter (7) has a pass band including a transmission band of a third communication band. The third transmission filter (7) includes a third substrate. The first substrate, the second substrate, and the third substrate are common. The third transmission filter (7) is a filter that is not used for simultaneous communication with either of the first transmission filter (1) and the second transmission filter (2). The metallic member (M1) includes a ground terminal (third ground terminal T73) connected to the third transmission filter (7).

In the radio-frequency module (200) according to the fifth aspect, for example, Under a condition simultaneous communication is performed using the first transmission filter (1) and the second transmission filter (2), heat generated in the first transmission filter (1) and the second transmission filter (2) can be dissipated through the metallic member (M1) including the ground terminal (third ground terminal T73) connected to the third transmission filter (7).

In the radio-frequency module (200) according to a sixth aspect, in the fifth aspect, the first communication band is Band 1 of the 3GPP LTE standard or n1 of the 5G NR standard, the second communication band is Band 3 of the 3GPP LTE standard or n3 of the 5G NR standard, and the third communication band is any one of Band 25 of the 3GPP LTE standard, n25 of the 5G NR standard, Band 66 of the 3GPP LTE standard, n66 of the 5G NR standard, Band 34 of the 3GPP LTE standard, n34 of the 5G NR standard, Band 39 of the 3GPP LTE standard, and n39 of the 5G NR standard.

In the radio-frequency module (200) according to the sixth aspect, for example, it is possible to perform simultaneous communication of Band 1 of the 3GPP LTE standard or n1 of the 5G NR standard and Band 3 of the 3GPP LTE standard or n3 of the 5G NR standard by using the first transmission filter (1) and the second transmission filter (2).

In the radio-frequency module (200) according to a seventh aspect, in the fifth aspect, the first communication band is Band 25 of the 3GPP LTE standard or n25 of the 5G NR standard, the second communication band is Band 66 of the 3GPP LTE standard or n66 of the 5G NR standard, and the third communication band is any one of Band 1 of the 3GPP LTE standard, n1 of the 5G NR standard, Band 3 of the 3GPP LTE standard, n3 of the 5G NR standard, Band 34 of the 3GPP LTE standard, n34 of the 5G NR standard, Band 39 of the 3GPP LTE standard, and n39 of the 5G NR standard.

In the radio-frequency module (200) according to the seventh aspect, for example, it is possible to perform simultaneous communication of Band 25 of the 3GPP LTE standard or n25 of the 5G NR standard and Band 66 of the 3GPP LTE standard or n66 of the 5G NR standard by using the first transmission filter (1) and the second transmission filter (2).

In the radio-frequency module (200) according to an eighth aspect, in any one of the first to seventh aspects, the electronic component (10; 10a; 10b; 10c; 10e) further includes a first ground terminal (T13) connected to the first transmission filter (1) and a second ground terminal (T23) connected to the second transmission filter (2). In a side view from a second direction (D2), the first ground terminal (T13) is located between the first input terminal (T11) and the metallic member (M1), and the second ground terminal (T23) is located between the second input terminal (T21) and the metallic member (M1).

In the radio-frequency module (200) according to the eighth aspect, it is possible to improve isolation between the first transmission filter (1) and the second transmission filter (2).

In the radio-frequency module (200) according to a ninth aspect, in any one of the first to seventh aspects, the electronic component (10d) further includes the first ground terminal (T13) and the second ground terminal (T23). The first ground terminal (T13) is connected to the first transmission filter (1). The second ground terminal (T23) is connected to the second transmission filter (2). In a side view, the first input terminal (T11) is located between the first ground terminal (T13) and the metallic member (M1), and the second input terminal (T21) is located between the second ground terminal (T23) and the metallic member (M1).

In the radio-frequency module (200) according to the ninth aspect, heat generated in each of the first transmission filter (1) and the second transmission filter (2) can be dissipated through the metallic member (M1) in a shorter path.

The radio-frequency module (200) according to a tenth aspect further includes, in any one of the first to ninth aspects, a resin layer (170) and a shield layer (180). The shield layer (180) is arranged on the first main surface (211) of the mounting substrate (210) and covers an outer peripheral surface (10C) of the electronic component (10; 10a; 10b; 10c; 10d; 10e). The shield layer (180) covers the resin layer (170) and overlaps at least a part of the electronic component (10; 10a; 10b; 10c; 10d; 10e) in plan view from a thickness direction (D0) of the mounting substrate (210). The shield layer (180) is in contact with a main surface (10B) of the electronic component (10; 10a; 10B; 10c; 10d; 10e) on the side opposite to the mounting substrate (210) side.

In the radio-frequency module (200) according to the tenth aspect, heat generated in the first transmission filter (1) and the second transmission filter (2) can be easily dissipated through the shield layer (180), and heat dissipation can be further improved.

The radio-frequency module (200) according to an eleventh aspect further includes, in any one of the first to tenth aspects, a second electronic component (20) different from the first electronic component (10; 10a; 10b; 10c; 10d; 10e) which is the electronic component (10; 10a; 10b; 10c; 10d; 10e). The second electronic component (20) is mounted on the second main surface (212) of the mounting substrate (210).

The radio-frequency module (200) according to the eleventh aspect can be reduced in size in the configuration including the second electronic component (20).

The radio-frequency module (200) according to a twelfth aspect further includes, in the eleventh aspect, a first power amplifier (151) and a second power amplifier (152). The first power amplifier (151) is mounted on the first main surface (211) of the mounting substrate (210). The second power amplifier (152) is mounted on the first main surface (211) of the mounting substrate (210). The second electronic component (20) includes a switch (8). The switch (8) has a first terminal (80A), a second terminal (80B), a first selection terminal (81) connectable to the first terminal (80A), and a second selection terminal (82) connectable to the second terminal (80B). The first terminal (80A) is connected to an output terminal of the first power amplifier (151). The second terminal (80B) is connected to an output terminal of the second power amplifier (152). The first selection terminal (81) is connected to the first input terminal (T11). The second selection terminal (82) is connected to the second input terminal (T21).

The radio-frequency module (200) according to the twelfth aspect can perform simultaneous communication using the first transmission filter (1) and the second transmission filter (2) and communication using any one of the first transmission filter (1) and the second transmission filter (2).

In the radio-frequency module (200) according to a thirteenth aspect, in the twelfth aspect, the second electronic component (20) overlaps each of the first transmission filter (1) and the second transmission filter (2) in plan view from the thickness direction (D0) of the mounting substrate (210).

In the radio-frequency module (200) according to the thirteenth aspect, it is possible to shorten the wiring length between the switch (8) and each of the first transmission filter (1) and the second transmission filter (2), and to improve the filter performance of each of the first transmission filter (1) and the second transmission filter (2).

In the radio-frequency module (200) according to a fourteenth aspect, in the twelfth or thirteenth aspect, the second electronic component (20) includes a through conductor (204), a bump (205), and an external connection terminal (220). The through conductor (204) has a first end (241) on the mounting substrate (210) side and a second end (242) on the opposite side to the mounting substrate (210) side. The bump (205) is connected to the first end (241) of the through conductor (204). The external connection terminal (220) is connected to the second end (242) of the through conductor (204). The first end (241) of the through conductor (204) is connected to a ground conductor portion (104) of the mounting substrate (210) via the bump (205).

The radio-frequency module (200) according to the fourteenth aspect can improve isolation between the first transmission filter (1) and the second transmission filter (2).

In the radio-frequency module (200) according to a fifteenth aspect, in any one of the first to fourteenth aspects, each of the first transmission filter (1) and the second transmission filter (2) is a surface acoustic wave filter.

In the radio-frequency module (200) according to a sixteenth aspect, in any one of the first to fourteenth aspects, each of the first transmission filter (1) and the second transmission filter (2) is a bulk acoustic wave filter.

In the radio-frequency module (200) according to a seventeenth aspect, in any one of the first to fourteenth aspects, one of the first transmission filter (1) and the second transmission filter (2) is a surface acoustic wave filter, and the other is a bulk acoustic wave filter.

In the radio-frequency module (200) according to an eighteenth aspect, in any one of the first to seventeenth aspects, the metallic member (M1) is not connected to the first transmission filter (1) and the second transmission filter (2) on the first substrate and the second substrate.

A communication device (300) according to a nineteenth aspect includes the radio-frequency module (200) according to any one of the first to eighteenth aspects and a signal processing circuit (301). The signal processing circuit (301) is connected to the radio-frequency module (200).

In the communication device (300) according to the nineteenth aspect, it is possible to improve heat dissipation.

REFERENCE SIGNS LIST

1 FIRST TRANSMISSION FILTER
14 IDT ELECTRODE
14A FIRST BUSBAR
14B SECOND BUSBAR
14C FIRST ELECTRODE FINGER
14D SECOND ELECTRODE FINGER
15 FIRST WIRING PORTION
16 FIRST INPUT WIRING PORTION
17 FIRST OUTPUT WIRING PORTION
18 FIRST GROUND WIRING PORTION
2 SECOND TRANSMISSION FILTER
24 IDT ELECTRODE
24A FIRST BUSBAR
24B SECOND BUSBAR
24C FIRST ELECTRODE FINGER
24D SECOND ELECTRODE FINGER
25 SECOND WIRING PORTION
26 SECOND INPUT WIRING PORTION
27 SECOND OUTPUT WIRING PORTION
28 SECOND GROUND WIRING PORTION
3 RECEPTION FILTER (FIRST RECEPTION FILTER)
34 IDT ELECTRODE
34A FIRST BUSBAR
34B SECOND BUSBAR
34C FIRST ELECTRODE FINGER
34D SECOND ELECTRODE FINGER
35 THIRD WIRING PORTION
36 THIRD INPUT WIRING PORTION
37 THIRD OUTPUT WIRING PORTION
38 THIRD GROUND WIRING PORTION
4 SECOND RECEPTION FILTER
44 IDT ELECTRODE
44A FIRST BUSBAR
44B SECOND BUSBAR
44C FIRST ELECTRODE FINGER
44D SECOND ELECTRODE FINGER

45 FOURTH WIRING PORTION
46 FOURTH INPUT WIRING PORTION
47 FOURTH OUTPUT WIRING PORTION
48 FOURTH GROUND WIRING PORTION
5 THIRD TRANSMISSION FILTER
6 FOURTH TRANSMISSION FILTER
7 THIRD TRANSMISSION FILTER
74 IDT ELECTRODE
75 THIRD WIRING PORTION
76 THIRD INPUT WIRING PORTION
77 THIRD OUTPUT WIRING PORTION
78 THIRD GROUND WIRING PORTION
8 SWITCH (FIRST SWITCH)
80A FIRST TERMINAL
80B SECOND TERMINAL
81 SELECTION TERMINAL (FIRST SELECTION TERMINAL)
82 SELECTION TERMINAL (SECOND SELECTION TERMINAL)
83 SELECTION TERMINAL (THIRD SELECTION TERMINAL)
84 SELECTION TERMINAL (FOURTH SELECTION TERMINAL)
9 SECOND SWITCH
90 COMMON TERMINAL
91 SELECTION TERMINAL
92 SELECTION TERMINAL
10, 10a, 10b, 10c, 10d, 10e ELECTRONIC COMPONENT (FIRST ELECTRONIC COMPONENT)
10A MAIN SURFACE
10B MAIN SURFACE
10C OUTER PERIPHERAL SURFACE
100 SUBSTRATE
101 FIRST MAIN SURFACE
102 SECOND MAIN SURFACE
104 GROUND CONDUCTOR PORTION
106 SPACER LAYER
107 COVER MEMBER
20 SECOND ELECTRONIC COMPONENT
202 MAIN SURFACE
203 OUTER PERIPHERAL SURFACE
204 THROUGH CONDUCTOR
241 FIRST END
242 SECOND END
205 BUMP
151 FIRST POWER AMPLIFIER
1512 MAIN SURFACE
1513 OUTER PERIPHERAL SURFACE
152 SECOND POWER AMPLIFIER
161 FIRST LOW NOISE AMPLIFIER
162 SECOND LOW NOISE AMPLIFIER
170 RESIN LAYER (FIRST RESIN LAYER)
171 MAIN SURFACE
173 OUTER PERIPHERAL SURFACE
180 SHIELD LAYER
190 SECOND RESIN LAYER
191 MAIN SURFACE
193 OUTER PERIPHERAL SURFACE
200 RADIO-FREQUENCY MODULE
210 MOUNTING SUBSTRATE
211 FIRST MAIN SURFACE
212 SECOND MAIN SURFACE
213 OUTER PERIPHERAL SURFACE
220 EXTERNAL CONNECTION TERMINAL
221 ANTENNA TERMINAL
222 FIRST SIGNAL INPUT TERMINAL
223 SECOND SIGNAL INPUT TERMINAL

224 FIRST SIGNAL OUTPUT TERMINAL
225 SECOND SIGNAL OUTPUT TERMINAL
226 GROUND TERMINAL
300 COMMUNICATION DEVICE
301 SIGNAL PROCESSING CIRCUIT
302 RF SIGNAL PROCESSING CIRCUIT
303 BASEBAND SIGNAL PROCESSING CIRCUIT
310 ANTENNA
E1 FIRST FUNCTIONAL ELECTRODE
E2 SECOND FUNCTIONAL ELECTRODE
E30 GROUND ELECTRODE
M1 METALLIC MEMBER
T11 FIRST INPUT TERMINAL
T12 FIRST OUTPUT TERMINAL
T13 FIRST GROUND TERMINAL
T21 SECOND INPUT TERMINAL
T22 SECOND OUTPUT TERMINAL
T23 SECOND GROUND TERMINAL
T31 THIRD INPUT TERMINAL
T32 THIRD OUTPUT TERMINAL
T33 THIRD GROUND TERMINAL
T41 FOURTH INPUT TERMINAL
T42 FOURTH OUTPUT TERMINAL
T43 FOURTH GROUND TERMINAL
T71 THIRD INPUT TERMINAL
T72 THIRD OUTPUT TERMINAL
T73 THIRD GROUND TERMINAL
D0 THICKNESS DIRECTION
D1 FIRST DIRECTION
D1a FIRST DIRECTION
D2 SECOND DIRECTION
D2a SECOND DIRECTION

The invention claimed is:

1. A radio-frequency module comprising:
a mounting substrate having a first main surface on an opposite side as a second main surface; and
an electronic component mounted on the first main surface of the mounting substrate,
wherein the electronic component includes:
a first transmission filter having a pass band including a transmission band of a first communication band;
a second transmission filter having a pass band including a transmission band of a second communication band;
a first input terminal and a first output terminal respectively connected to an input end and an output end of a signal path of the first transmission filter; and
a second input terminal and a second output terminal respectively connected to an input end and an output end of a signal path of the second transmission filter,
the first transmission filter includes a first substrate,
the second transmission filter includes a second substrate,
the first substrate and the second substrate are common,
the first communication band and the second communication band are communication bands available for simultaneous communication, and
the electronic component further includes a metallic member at ground potential arranged at least at one of
between the first input terminal and the second input terminal, and
between the first output terminal and the second output terminal in a side view.

2. The radio-frequency module according to claim 1, wherein the metallic member is a bump having an elongated shape.

3. The radio-frequency module according to claim 1, wherein the electronic component further includes a reception filter, the reception filter includes a third substrate, the first substrate, the second substrate, and the third substrate are common, and the metallic member includes a ground terminal connected to the reception filter.

4. The radio-frequency module according to claim 1, wherein the electronic component further includes a third transmission filter having a pass band including a transmission band of a third communication band, the third transmission filter includes a third substrate, the first substrate, the second substrate, and the third substrate are common, the third transmission filter is a filter that is not used in simultaneous communication with either of the first transmission filter and the second transmission filter, and the metallic member includes a ground terminal connected to the third transmission filter.

5. The radio-frequency module according to claim 4, wherein the first communication band is Band 1 of the 3GPP LTE standard or n1 of the 5G NR standard, the second communication band is Band 3 of the 3GPP LTE standard or n3 of the 5G NR standard, and the third communication band is any one of Band 25 of the 3GPP LTE standard, n25 of the 5G NR standard, Band 66 of the 3GPP LTE standard, n66 of the 5G NR standard, Band 34 of the 3GPP LTE standard, n34 of the 5G NR standard, Band 39 of the 3GPP LTE standard, and n39 of the 5G NR standard.

6. The radio-frequency module according to claim 4, wherein the first communication band is Band 25 of the 3GPP LTE standard or n25 of the 5G NR standard, and the second communication band is Band 66 of the 3GPP LTE standard or n66 of the 5G NR standard, and the third communication band is any one of Band 1 of the 3GPP LTE standard, n1 of the 5G NR standard, Band 3 of the 3GPP LTE standard, n3 of the 5G NR standard, Band 34 of the 3GPP LTE standard, n34 of the 5G NR standard, Band 39 of the 3GPP LTE standard, and n39 of the 5G NR standard.

7. The radio-frequency module according to claim 1, wherein the electronic component further includes:

a first ground terminal connected to the first transmission filter; and a second ground terminal connected to the second transmission filter, and the first ground terminal is located between the first input terminal and the metallic member, and the second ground terminal is located between the second input terminal and the metallic member in a side view.

8. The radio-frequency module according to claim 1, wherein the electronic component further includes:

a first ground terminal connected to the first transmission filter; and a second ground terminal connected to the second transmission filter, and the first input terminal is located between the first ground terminal and the metallic member, and the second input terminal is located between the second ground terminal and the metallic member in a side view.

9. The radio-frequency module according to claim 1, further comprising:

a resin layer arranged on the first main surface of the mounting substrate and covering an outer peripheral surface of the electronic component; and a shield layer covering the resin layer and overlapping at least a part of the electronic component in plan view from the thickness direction of the mounting substrate, wherein the shield layer is in contact with a main surface of the electronic component on a side opposite to the mounting substrate side.

10. The radio-frequency module according to claim 1, further comprising a second electronic component mounted on the second main surface of the mounting substrate, the second electronic component being different from a first electronic component that is the electronic component.

11. The radio-frequency module according to claim 10, further comprising:

a first power amplifier mounted on the first main surface of the mounting substrate; and a second power amplifier mounted on the first main surface of the mounting substrate, wherein the second electronic component includes a switch having a first terminal, a second terminal, a first selection terminal connectable to the first terminal, and a second selection terminal connectable to the second terminal, the first terminal is connected to an output terminal of the first power amplifier, the second terminal is connected to an output terminal of the second power amplifier, the first selection terminal is coupled to the first input terminal, and the second selection terminal is connected to the second input terminal.

12. The radio-frequency module according to claim 11, wherein the second electronic component overlaps each of the first transmission filter and the second transmission filter in plan view from the thickness direction of the mounting substrate.

13. The radio-frequency module according to claim 11, wherein the second electronic component includes:

a through conductor having a first end on the mounting substrate side and a second end on a side opposite to the mounting substrate side;

a bump connected to the first end of the through conductor;

an external connection terminal connected to the second end of the through conductor, and the first end of the through conductor is connected to a ground conductor portion of the mounting substrate via the bump.

14. The radio-frequency module according to claim 1, wherein each of the first transmission filter and the second transmission filter is a surface acoustic wave filter.

15. The radio-frequency module according to claim 1, wherein each of the first transmission filter and the second transmission filter is a bulk acoustic wave filter.

16. The radio-frequency module according to claim 1, wherein one of the first transmission filter and the second transmission filter is a surface acoustic wave filter, and the other is a bulk acoustic wave filter.

17. The radio-frequency module according to claim 1, wherein the metallic member is not connected to the first transmission filter and the second transmission filter on the first substrate and the second substrate.

18. A communication device comprising:

the radio-frequency module according to claim 1; and a signal processing circuit connected to the radio-frequency module.

19. A radio-frequency module comprising:

a mounting substrate having a first main surface on an opposite side as a second main surface; and an electronic component mounted on the first main surface of the mounting substrate, wherein the electronic component includes:

a first transmission filter having a pass band including a transmission band of a first communication band;

a second transmission filter having a pass band including a transmission band of a second communication band;

a first input terminal and a first output terminal respectively connected to an input end and an output end of a signal path of the first transmission filter; and a second input terminal and a second output terminal respectively connected to an input end and an output end of a signal path of the second transmission filter, the first transmission filter includes:

a first substrate; and a first functional electrode provided on the first substrate and connected to the first input terminal, the second transmission filter includes:

a second substrate; and a second functional electrode provided on the second substrate and connected to the second input terminal, the first substrate and the second substrate are common, the first communication band and the second communication band are communication bands available for simultaneous communication, and the electronic component further includes a metallic member at ground potential arranged between the first functional electrode and the second functional electrode in a side view.

20. The radio-frequency module according to claim 19, wherein the metallic member is not connected to the first transmission filter and the second transmission filter on the first substrate and the second substrate.

* * * * *